United States Patent
Kim et al.

(10) Patent No.: US 9,917,240 B2
(45) Date of Patent: Mar. 13, 2018

(54) THERMOELECTRIC ELEMENT, METHOD OF MANUFACTURING THE SAME AND SEMICONDUCTOR DEVICE INCLUDING THE SAME

(71) Applicant: SAMSUNG ELECTRONICS CO., LTD., Suwon-si, Gyeonggi-Do (KR)

(72) Inventors: Kwang-Ho Kim, Gyeonggi-do (KR); Jun-Hyeok Yang, Gyeonggi-do (KR); Hyung-Jong Ko, Gyeonggi-do (KR); Se-Ki Kim, Gyeonggi-do (KR); Ho-Jin Park, Gyeonggi-do (KR); Se-Ra An, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 93 days.

(21) Appl. No.: 14/740,466

(22) Filed: Jun. 16, 2015

(65) Prior Publication Data

US 2016/0027986 A1    Jan. 28, 2016

Related U.S. Application Data

(60) Provisional application No. 62/028,522, filed on Jul. 24, 2014.

(30) Foreign Application Priority Data

Nov. 26, 2014    (KR) .................. 10-2014-0166117

(51) Int. Cl.
*H01L 35/00* (2006.01)
*H01L 37/00* (2006.01)
(Continued)

(52) U.S. Cl.
CPC .............. *H01L 35/32* (2013.01); *H01L 25/18* (2013.01); *H01L 27/16* (2013.01); *H01L 2924/0002* (2013.01); *Y10S 257/93* (2013.01)

(58) Field of Classification Search
CPC ....... Y10S 257/93; H01L 35/32; H01L 23/38; H01L 27/16; H01L 25/18; H01L 2924/0002
(Continued)

(56) References Cited

U.S. PATENT DOCUMENTS 7,279,375 B2    10/2007    Radosavljevic et al.
7,557,367 B2    7/2009     Rogers et al.
(Continued)

FOREIGN PATENT DOCUMENTS

JP    2013165220    8/2013
JP    2013179274    9/2013
(Continued)

*Primary Examiner* — Angelo Trivisonno
(74) *Attorney, Agent, or Firm* — F. Chau & Associates, LLC

(57) ABSTRACT

A thermoelectric element is provided as follows. First and second semiconductor fin structures are disposed on a semiconductor substrate. Each semiconductor fin structure extends in a first direction, protruding from the semiconductor substrate. First and second semiconductor nanowires are disposed on the first and second semiconductor fin structures, respectively. The first semiconductor nanowires include first impurities. The second semiconductor nanowires include second impurities different from the first impurities. A first electrode is connected to first ends of the first and second semiconductor nanowires. A second electrode is connected to second ends of the first semiconductor nanowires. A third electrode is connected to second ends of the second semiconductor nanowires.

15 Claims, 29 Drawing Sheets

(51) Int. Cl.
    *H01L 29/76*     (2006.01)
    *H01L 21/70*     (2006.01)
    *H01L 35/32*     (2006.01)
    *H01L 25/18*     (2006.01)
    *H01L 27/16*     (2006.01)

(58) Field of Classification Search
    USPC .......................................... 257/288, 368, 369
    See application file for complete search history.

(56) References Cited

U.S. PATENT DOCUMENTS

| | | |
|---|---|---|
| 7,663,166 B2 | 2/2010 | Kim et al. |
| 7,893,466 B2 | 2/2011 | Yang et al. |
| 7,893,492 B2 | 2/2011 | Bedell et al. |
| 8,293,624 B2 | 10/2012 | Romano et al. |
| 8,377,779 B1 * | 2/2013 | Wang ................ H01L 29/66795 |
| | | 257/E21.421 |
| 2011/0198498 A1 * | 8/2011 | Park ...................... B82Y 15/00 |
| | | 250/330 |
| 2013/0240983 A1 | 9/2013 | Larrieu |
| 2014/0024202 A1 | 1/2014 | Lagally et al. |

FOREIGN PATENT DOCUMENTS

| | | |
|---|---|---|
| KR | 100718159 | 5/2007 |
| KR | 1020090062373 | 6/2009 |
| KR | 1020100025603 | 3/2010 |

\* cited by examiner

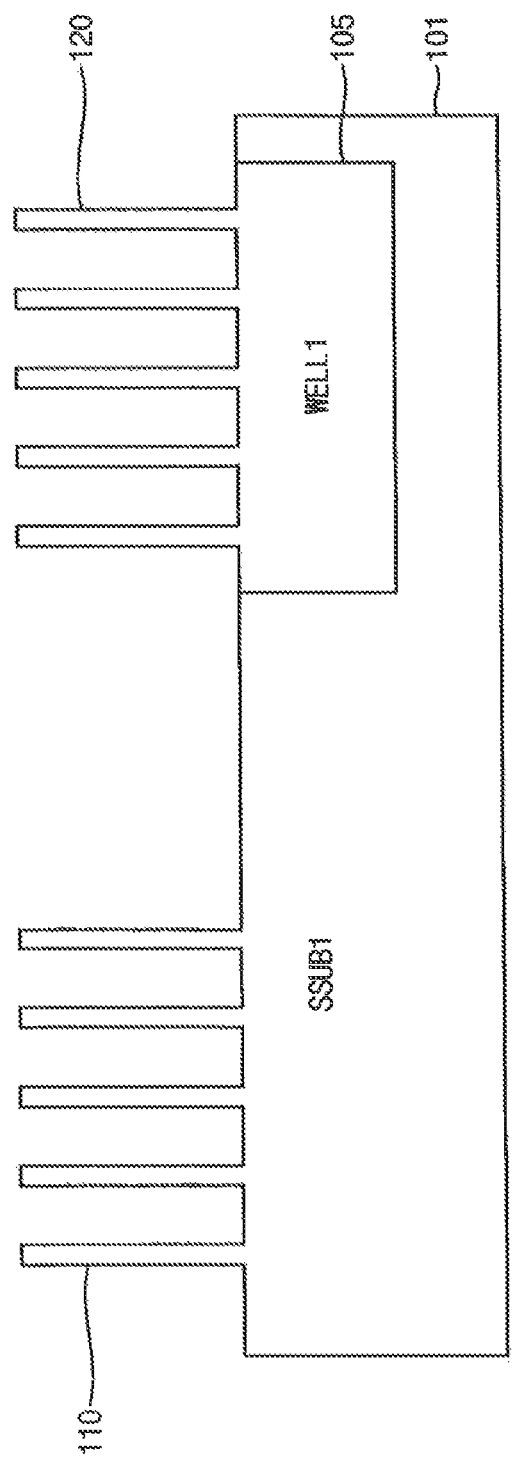

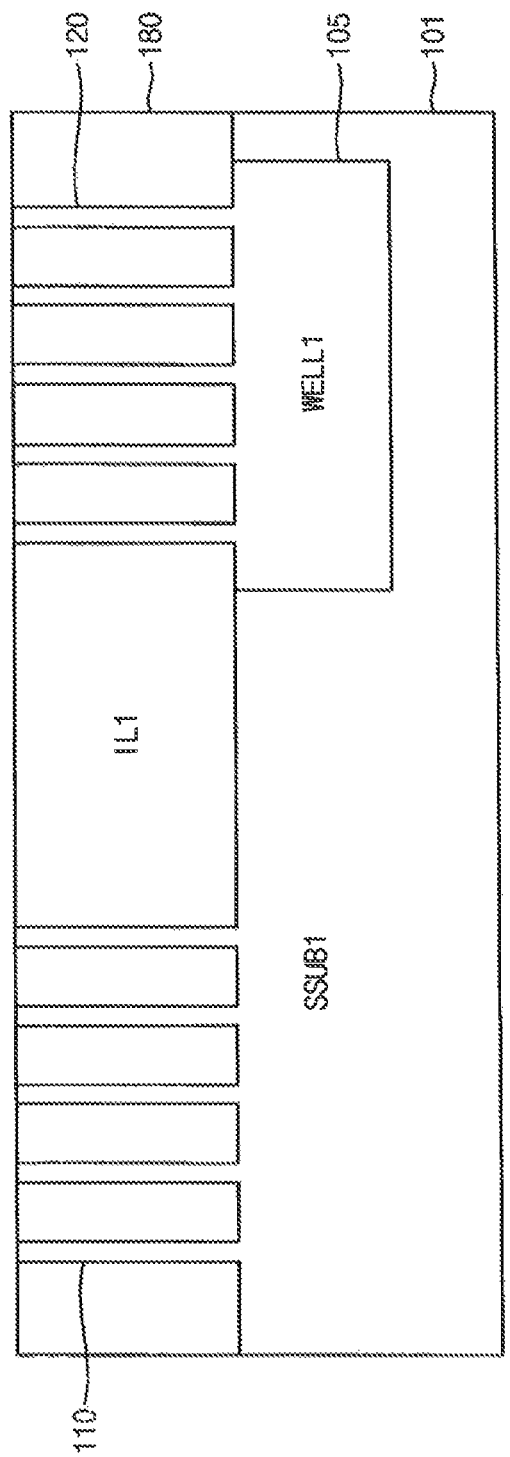

THERMOELECTRIC ELEMENT, METHOD OF MANUFACTURING THE SAME AND SEMICONDUCTOR DEVICE INCLUDING THE SAME

CROSS-REFERENCE TO RELATED APPLICATION

This application claims priority under 35 USC § 119 to U.S. Provisional Application No. 62/028,522 filed on Jul. 24, 2014 in the USPTO, and Korean Patent Application No. 10-2014-0166117, filed on Nov. 26, 2014, in the Korean Intellectual Property Office (KIPO), the disclosures of which are incorporated by reference in their entireties.

TECHNICAL FIELD

The present inventive concept relates to thermoelectric elements, methods of manufacturing the thermoelectric elements and semiconductor devices including the thermoelectric elements.

DISCUSSION OF THE RELATED ART

As the degree of integration of semiconductor devices increases, a larger number of components may be integrated into one semiconductor device, and the operation speed of the semiconductor device gradually increases. As the degree of integration and the operation speed of the semiconductor device increases, a greater amount of heat may be emitted within the semiconductor device, and a local temperature difference may occur within the semiconductor device due to the operating conditions thereof.

SUMMARY

According to an exemplary embodiment of the present inventive concept, a thermoelectric element is provided as follows. First and second semiconductor fin structures are disposed on a semiconductor substrate. Each semiconductor fin structure extends in a first direction, protruding from the semiconductor substrate. First and second semiconductor nanowires are disposed on the first and second semiconductor fin structures, respectively. The first semiconductor nanowires include first impurities. The second semiconductor nanowires include second impurities different from the first impurities. A first electrode is connected to first ends of the first and second semiconductor nanowires. A second electrode is connected to second ends of the first semiconductor nanowires. A third electrode is connected to second ends of the second semiconductor nanowires.

According to an exemplary embodiment of the present inventive concept, a thermoelectric element is provided as follows. First semiconductor nanowires are disposed in a semiconductor substrate, extending in a first direction and including first impurities. Second semiconductor nanowires are disposed in the semiconductor substrate, extending in the first direction and including second impurities different from the first impurities. A first electrode is connected to first ends of the first and second semiconductor nanowires. A second electrode is connected to second ends of the first semiconductor nanowires. A third electrode is connected to second ends of the second semiconductor nanowires.

According to an exemplary embodiment of the present inventive concept, a method of manufacturing a thermoelectric element is provided as follows. First and second semiconductor fin structures are formed on a semiconductor substrate. Each of the first and second semiconductor fin structures protrudes from the semiconductor substrate, extending in a first direction. First semiconductor nanowires are formed on the first semiconductor fin structures. The first semiconductor nanowires include first impurities. Second semiconductor nanowires are formed on the second semiconductor fin structures. The second semiconductor nanowires include second impurities different from the first impurities. A first electrode is connected to first ends of the first and second semiconductor nanowires. A second electrode is connected to second ends of the first semiconductor nanowires. A third electrode is connected to second ends of the second semiconductor nanowires.

According to an exemplary embodiment of the present inventive concept, a method of manufacturing a thermoelectric element is provided as follows. First semiconductor nanowires are formed in a semiconductor substrate, the first semiconductor nanowires extending in a first direction and including first impurities. Second semiconductor nanowires are formed in the semiconductor substrate, the second semiconductor nanowires extending in the first direction and including second impurities different from the first impurities. A first electrode is connected to first ends of the first and second semiconductor nanowires. A second electrode is connected to second ends of the first semiconductor nanowires. A third electrode is connected to second ends of the second semiconductor nanowires.

According to an exemplary embodiment of the present inventive concept, a semiconductor device is provided as follows. A first semiconductor die includes a first thermoelectric element. A second semiconductor die is disposed on the first semiconductor die, having a first area and a second area. The first thermoelectric element includes first semiconductor nanowires extending in a first direction and including first impurities and second semiconductor nanowires extending in the first direction and including second impurities different from the first impurities. The first thermoelectric element further includes a first electrode connected to first ends of the first and second semiconductor nanowires and disposed on the first region of the second semiconductor die, a second electrode connected to second ends of the first semiconductor nanowires and a third electrode connected to second ends of the second semiconductor nanowires. The second and third electrodes are disposed on the second region of the second semiconductor die.

According to an exemplary embodiment of the present inventive concept, a semiconductor device is provided as follows. A semiconductor substrate includes a first area and a second area. In operation of the semiconductor device, a temperature of the first area is greater than a temperature of the second area. An on-die thermoelectric element is disposed in the semiconductor substrate. The first thermoelectric element includes first semiconductor nanowires extending in a first direction and including first impurities, and second semiconductor nanowires extending in the first direction and including second impurities different from the first impurities. The first thermoelectric element further includes a first electrode connected to first ends of the first and second semiconductor nanowires, a second electrode connected to second ends of the first semiconductor nanowires and a third electrode connected to second ends of the second semiconductor nanowires. The first electrode is disposed in the first area, and the second and third electrodes are disposed in the second area.

According to an exemplary embodiment of the present inventive concept, a semiconductor device is provided as follows. A semiconductor device includes a first region, a second region and a third region according a temperature distribution of the semiconductor device. A thermoelectric element includes a first electrode, a second electrode and a third electrode. The first electrode is disposed on the first region, and the second and third electrodes are disposed on the second region. The thermoelectric element includes first semiconductor nanowires connoting electrically the first electrode to the second electrode and second semiconductor nanowires connecting electrically the first electrode to the third electrode. The first and second semiconductor nanowires are disposed on the third region.

BRIEF DESCRIPTION OF THE DRAWINGS

These and other features of the inventive concept will become more apparent by describing in detail exemplary embodiments thereof with reference to the accompanying drawings of which;

FIGS. 2A, 2B, 2C and 2D are cross-sectional views for illustrating a method of manufacturing a thermoelectric element according to exemplary embodiments of the present inventive concept;

DETAILED DESCRIPTION OF EXEMPLARY EMBODIMENTS

Figure 1A:
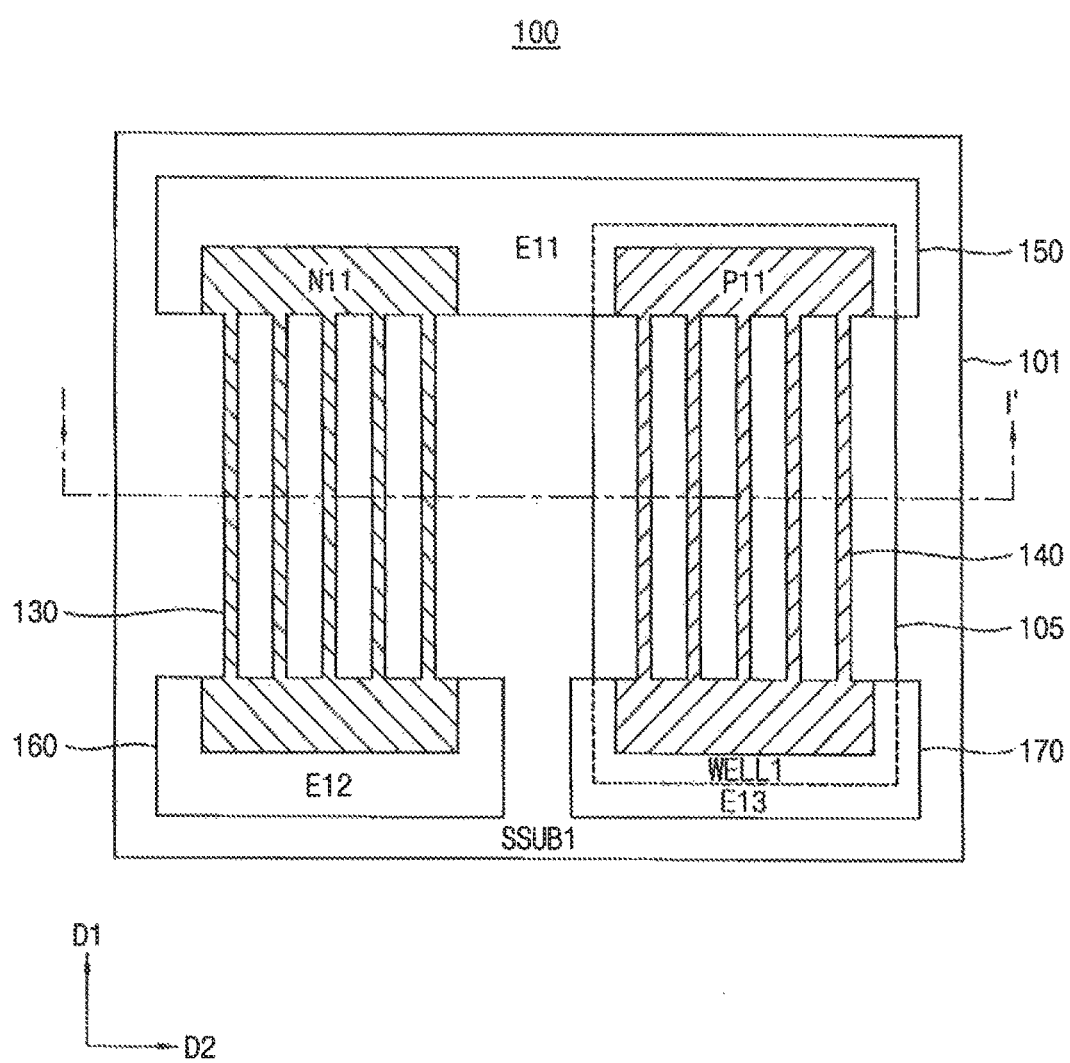
FIGS. 1A and 1B are diagrams illustrating a thermoelectric element according to exemplary embodiments of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 1B:
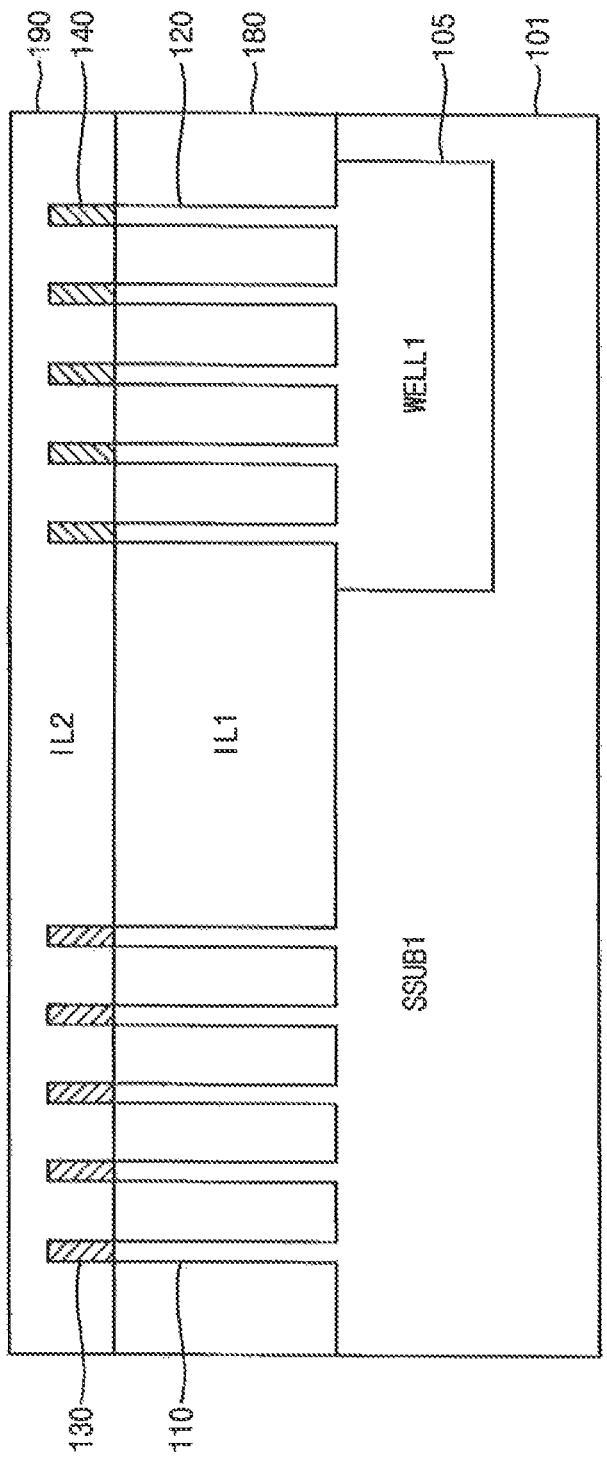

FIGS. 1A and 1B are diagrams illustrating a thermoelectric element according to an exemplary embodiment. FIG. 1A is a plan view of the thermoelectric element. FIG. 1B is a cross-sectional view of the thermoelectric element taken along line I-I' of FIG. 1A.

Referring to FIGS. 1A and 1B, a thermoelectric element 100 includes a semiconductor substrate 101 (SSUB1), a plurality of first semiconductor fin structures 110, a plurality of second semiconductor fin structures 120, a plurality of first semiconductor nanowires 130 (N11), a plurality of second semiconductor nanowires 140 (P11), a first electrode 150 (E11), a second electrode 160 (E12) and a third electrode 170 (E13). The thermoelectric element 100 may further include a first well region 105 (WELL1), a first insulation layer 180 (IL1) and a second insulation layer 190 (IL2).

Each of the plurality of first and second semiconductor fin structures 110 and 120 is formed to protrude from the semiconductor substrate 101 and extends in a first direction D1. The plurality of first semiconductor fin structures 110 may be arranged in a second direction D2 crossing (e.g., substantially perpendicular to) the first direction D1, and the plurality of second semiconductor fin structures 120 may be arranged in the second direction D2. The second semiconductor fin structures 120 may be spaced apart from the first semiconductor fin structures 110. The first semiconductor fin structures 110 may be spaced apart from each other, and the second semiconductor fin structures 120 may be spaced apart from each other.

The plurality of first semiconductor nanowires 130 are formed on the plurality of first semiconductor fin structures 110. For example, each of the first semiconductor nanowires 130 may be formed on a respective one of the first semiconductor fin structures 110. The first semiconductor nanowires 130 include first impurities. For example, the first impurities may be N-type impurities. Similarly to the first semiconductor fin structures 110, each of the first semiconductor nanowires 130 may extend in the first direction D1, and the plurality of first semiconductor nanowires 130 may be arranged in the second direction D2.

The plurality of second semiconductor nanowires 140 are formed on the plurality of second semiconductor fin structures 120. For example, each of the second semiconductor nanowires 140 may be formed on a respective one of the second semiconductor fin structures 120. The second semiconductor nanowires 140 include second impurities different from the first impurities. For example, the second impurities may be P-type impurities. Similarly to the second semiconductor fin structures 120, each of the second semiconductor nanowires 140 may extend in the first direction D1, and the plurality of second semiconductor nanowires 140 may be arranged in the second direction D2.

In some exemplary embodiments, each of the first and second semiconductor fin structures 110 and 120 may extend in the first direction D1 with a straight line shape, and thus each of the first and second semiconductor nanowires 130 and 140 may also extend in the first direction D1 with the straight line shape.

As illustrated in FIG. 1A, first ends of the first semiconductor nanowires 130 may be connected to each other, and second ends of the first semiconductor nanowires 130 may be connected to each other. For example, first ends of the second semiconductor nanowires 140 may be connected to each other, and second ends of the second semiconductor nanowires 140 may be connected to each other.

The first electrode 150 is connected to the first ends of the first semiconductor nanowires 130 and the first ends of the second semiconductor nanowires 140. The second electrode 160 is connected to the second ends of the first semiconductor nanowires 130. The third electrode 170 is connected to the second ends of the second semiconductor nanowires 140. The first, second and third electrodes 150, 160 and 170 may be formed on the second insulation layer 190. The first electrode 150 may be referred to as a common electrode such that the first and second semiconductor nanowires 130 and 140 are commonly and electrically connected to each other by the first electrode 150.

In some exemplary embodiments, the semiconductor substrate 101 may include a first area and a second area spaced apart from the first area. The first electrode 150 may be disposed in the first area of the semiconductor substrate 101, and the second and third electrodes 160 and 170 may be disposed in the second area of the semiconductor substrate 101. For example, the second area may be farthest from the first area within the semiconductor substrate 101. As will be described below with reference to FIGS. 3A and 3B, a voltage may be applied to the thermoelectric element 100 through the second and third electrodes 160 and 170 to perform a horizontal heat distributing operation, or a load may be connected to the thermoelectric element 100 (e.g., connected between the second and third electrodes 160 and 170) to perform an energy generating operation.

The first well region 105 may be formed under the second semiconductor fin structures 120 within the semiconductor substrate 101.

In some exemplary embodiments, the first well region 105 and the second semiconductor fin structures 120 may include the first impurities, respectively. The semiconductor substrate 101 and the first semiconductor fin structures 110 may include the second impurities, respectively. For example, the first well region 105, the second semiconductor fin structures 120 and the first semiconductor nanowires 130 may include the same type (e.g., N-type) of impurities. The semiconductor substrate 101, the first semiconductor fin structures 110 and the second semiconductor nanowires 140 may include the same type (e.g., P-type) of impurities.

In some exemplary embodiments, a doping density of the first semiconductor nanowires 130 may be higher than a doping density of the first well region 105 and a doping density of the second semiconductor fin structures 120, respectively. A doping density of the second semiconductor nanowires 140 may be higher than a doping density of the semiconductor substrate 101 and a doping density of the first semiconductor fin structures 110, respectively. For example, the first well region 105 and the second semiconductor fin structures 120 may be an N-type region, respectively, and the first semiconductor nanowires 130 may be an (N+)-type region. The semiconductor substrate 101 and the first semiconductor fin structures 110 may be a P-type region, respectively, and the second semiconductor nanowires 140 may be a (P+)-type region.

The first insulation layer 180 may be formed between the first and second semiconductor fin structures 110 and 120 on the semiconductor substrate 101. The second insulation layer 190 may be formed between the first and second semiconductor nanowires 130 and 140 on the first insulation layer 180.

FIGS. 2A, 2B, 2C and 2D are cross-sectional views for illustrating a method of manufacturing a thermoelectric element according to exemplary embodiments.

Figure 2A:
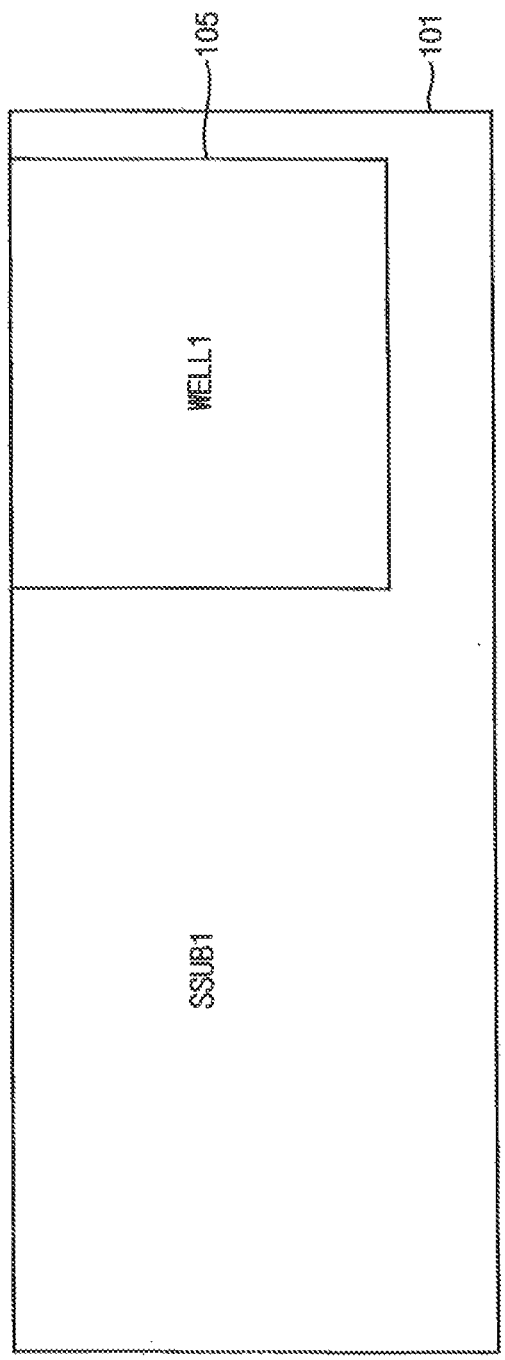

Referring to FIG. 2A, the first well region 105 including the first impurities is formed within the semiconductor substrate 101 including the second impurities. For example, a region (e.g., an N-type region) of a conductivity type that is opposite to that of the semiconductor substrate 101 (e.g., a P-type semiconductor substrate) may be formed in the semiconductor substrate 101 using an ion implantation process to form the first well region 105. As will be described below with reference to FIG. 2B, the first well region 105 may be formed under the second semiconductor fin structures 120 within the semiconductor substrate 101.

Referring to FIG. 2B, the first and second semiconductor fin structures 110 and 120 are formed to protrude from the semiconductor substrate 101. Each of the first and second semiconductor fin structures 110 and 120 extends in the first direction D1. The plurality of first semiconductor fin structures 110 and the plurality of second semiconductor fin structures 120 may be arranged in the second direction D2. For example, the first and second semiconductor fin structures 110 and 120 may be formed by etching some of upper portions of the semiconductor substrate 101 and the first well region 105 to a predetermined or given depth using a dry etching process and/or a wet etching process. The first semiconductor fin structures 110 may include impurities (e.g., the P-type impurities) substantially the same as that of the semiconductor substrate 101. The second semiconductor fin structures 120 may include impurities (e.g., the N-type impurities) substantially the same as that of the first well region 105.

In some example embodiments, a width of each of the first and second semiconductor fin structures 110 and 120 may be substantially equal to or less than about 100 nm. For example, each of the first and second semiconductor fin structures 110 and 120 may have a width of about 50 nm to about 100 nm.

In some exemplary embodiments, the first and second semiconductor fin structures 110 and 120 may be substantially simultaneously or concurrently formed. In other exemplary embodiments, the first and second semiconductor fin structures 110 and 120 may be sequentially formed. For example, the second semiconductor fin structures 120 may be formed after the first semiconductor fin structures 110 are formed.

Although FIG. 2B illustrates that an upper portion and a lower portion of a semiconductor fin structure have substantially the same width, an upper portion and a lower portion of a semiconductor fin structure may have different widths. For example, a width of the upper portion of the semiconductor fin structure may be less than a width of the lower portion of the semiconductor fin structure or may decrease downwardly.

Referring to FIG. 2C, the first insulation layer 180 is formed between the first and second semiconductor fin structures 110 and 120 on the semiconductor substrate 101. For example, the first insulation layer 180 may be formed of at least one of silicon oxide (SiOx), silicon oxynitride (SiOxNy), silicon nitride (SiNx), germanium oxynitride (GeOxNy), germanium silicon oxide (GeSixOy), and high-k dielectric materials including hafnium oxide (HfOx), zirconium oxide (ZrOx), aluminum oxide (AlOx), tantalum oxide (TaOx), hafnium silicate (HfSix), or zirconium silicate (ZrSix).

Figure 2D:
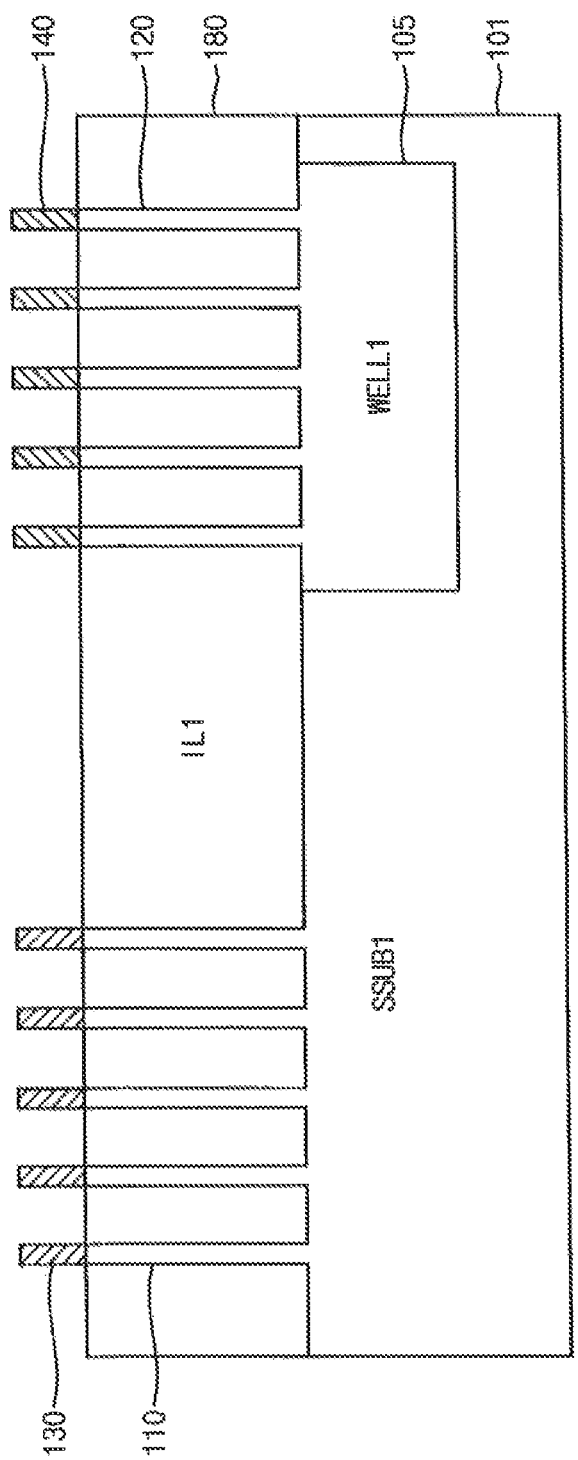

Referring to FIG. 2D, the first semiconductor nanowires 130 including the first impurities (e.g., the N-type impurities) are formed on the first semiconductor fin structures 110, and the second semiconductor nanowires 140 including the second impurities (e.g., the P-type impurities) are formed on the second semiconductor fin structures 120. Each of the first and second semiconductor nanowires 130 and 140 extends in the first direction D1. The plurality of first semiconductor nanowires 130 and the plurality of second semiconductor nanowires 140 may be arranged in the second direction D2. For example, regions (e.g., (N+)-type regions) of a conductivity type that is opposite to that of the first semiconductor fin structures 110 (e.g., P-type regions) may be formed on the first semiconductor fin structures 110 to form the first semiconductor nanowires 130. Regions (e.g., (P+)-type regions) of a conductivity type that is opposite to that of the second semiconductor fin structures 120 (e.g., N-type regions) may be formed on the second semiconductor fin structures 120 to form the second semiconductor nanowires 140.

In some exemplary embodiments, similarly to the first and second semiconductor fin structures 110 and 120, a width of each of the first and second semiconductor nanowires 130 and 140 may be substantially equal to or less than about 100 nanometer (nm). For example, each of the first and second semiconductor nanowires 130 and 140 may have a width of about 50 nm to about 100 nm.

In some exemplary embodiments, the first and second semiconductor nanowires 130 and 140 may be substantially simultaneously or concurrently formed. In other exemplary embodiments, the first and second semiconductor nanowires 130 and 140 may be sequentially formed.

Referring back to FIG. 1B, the second insulation layer 190 is formed between the first and second semiconductor nanowires 130 and 140 on the first insulation layer 180. For example, the second insulation layer 190 may be formed of material substantially the same as that of the first insulation layer 180.

Referring back to FIG. 1A, the first, second and third electrodes 150, 160 and 170 are formed on the second insulation layer 190. The first electrode 150 is connected to the first ends of the first semiconductor nanowires 130 and the first ends of the second semiconductor nanowires 140. The second electrode 160 is connected to the second ends of the first semiconductor nanowires 130. The third electrode 170 is connected to the second ends of the second semiconductor nanowires 140. For example, the first, second and third electrodes 150, 160 and 170 may include at least one of copper, tungsten, titanium and aluminum.

Although the exemplary embodiments described above illustrate the manufacturing order of the well region 105, the semiconductor fin structures 110 and 120, the insulation layer 180, the semiconductor nanowires 130 and 140, the insulation layer 190 and the electrodes 150, 160 and 170, the manufacturing order need not be limited thereto.

Figure 3A:
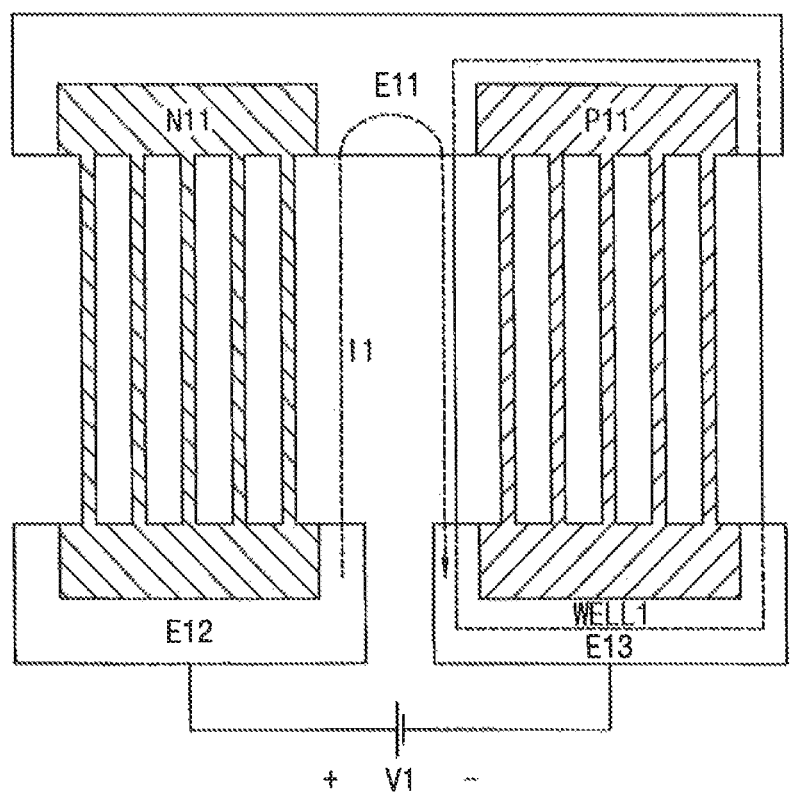
FIGS. 3A and 3B are diagrams for illustrating an operation of the thermoelectric element of FIGS. 1A and 1B according to exemplary embodiment of the present inventive concept.
Figure 3B:
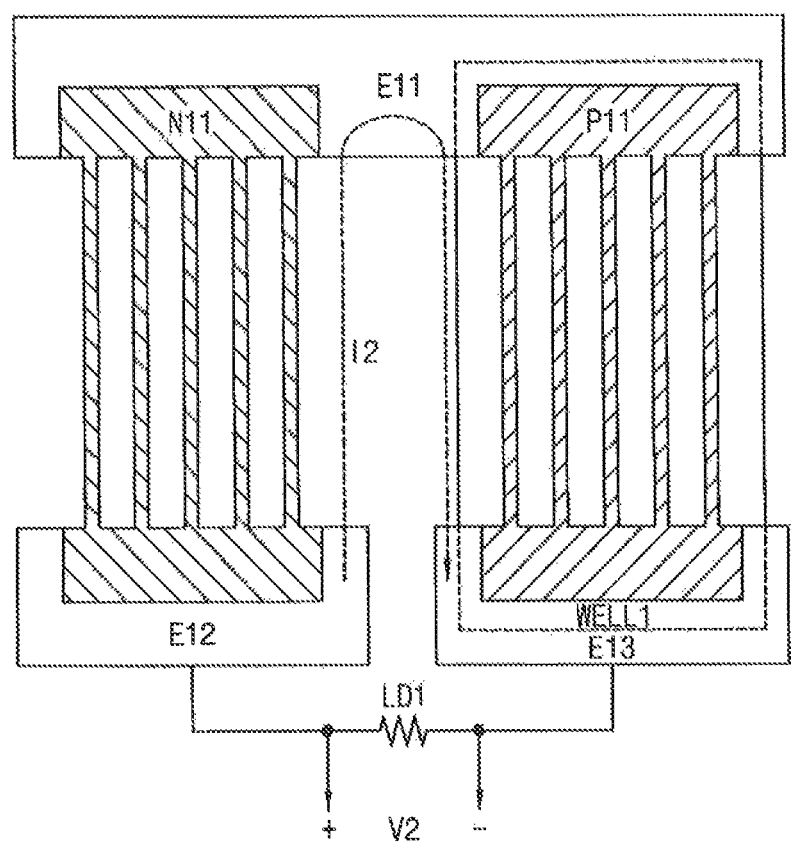

FIGS. 3A and 3B are diagrams for illustrating an operation of the thermoelectric element of FIGS. 1A and 1B according to exemplary embodiments.

Referring to FIGS. 3A and 3B, the thermoelectric element 100 according to exemplary embodiments may perform one of the horizontal heat distributing operation and the energy generating operation. In the horizontal heat distributing operation, heat generated at the first area in which the first electrode E11 is disposed may be horizontally distributed toward the second area in which the second and third electrodes E12 and E13 are disposed. In the energy generating operation, power may be generated based on the heat generated from the first area.

As illustrated in FIG. 3A, to perform the horizontal heat distributing operation, a first voltage V1 may be applied to the thermoelectric element 100. For example, electric potentials may be provided to the second electrode E12 and the third electrode E13. During the performance of the horizontal heat distributing operation, the first voltage V1 may correspond to a potential difference between the second electrode E12 and the third electrode E13. A first current I1 may be induced by the first voltage V1. For example, in the first semiconductor nanowires N11, electrons of electron-hole pairs may move in a direction from the first electrode E11 to the second electrode E12 due to the first voltage V1. In the second semiconductor nanowires P11, holes of electron-hole pairs may move in a direction from the first electrode E11 to the third electrode E13 due to the first voltage V1. The first current I1 may flow through the thermoelectric element 100 due to the movement of the electrons and the holes. A thermoelectric effect may be caused by the first current I1, and heat may be horizontally distributed by converting electric energy into thermal energy. For example, the heat generated from an area near the first electrode E11 (e.g., the first area) may be absorbed by the thermoelectric element 100, and the heat may be dissipated at an area near the second and third electrodes E12 and E13 (e.g., the second area). The heat generated from the first area is proportional to the magnitude of the first voltage V1.

As illustrated in FIG. 3B, to perform the energy generating operation, a first load LD1 may be connected to the thermoelectric element 100. For example, the first load LD1 may be connected between the second electrode E12 and the third electrode E13. The heat generated in the area near the first electrode E11 (e.g., the first area) may cause a voltage differential between the second electrode E12 and the third electrode E13. Thermal energy may be converted into electric energy. For example, in the first semiconductor nanowires N11, electrons may move from the first electrode E11 to the second electrode E12 based on a temperature difference between the area near the first electrode E11 and the area near the second electrode E2 (e.g., the second area). In the second semiconductor nanowires P11, holes may move from the first electrode E11 to the third electrode E13 based on a temperature difference between the area near the first electrode E11 and the area near the third electrode E13 (e.g., the second area). Thus, a second current I2 may flow through the thermoelectric element 100 due to the movement of the electrons and the holes. A second voltage V2 may be induced by the second current I2. In the energy generating operation, the second voltage V2 may correspond to a potential difference between the second electrode E12 and the third electrode E13. Power may be collected from the heat differential between the first electrode E11 and the second/third electrode E12 and E13. The power collected may be determined based on the second voltage V2. As will be described later, the collected power may be used to operate active elements and/or passive elements, or to recharge an external battery.

In some exemplary embodiments, a reverse bias (e.g., a negative voltage) may be applied to the first well region 105 in the horizontal heat distributing operation or the energy generating operation. An electrical insulation between the semiconductor substrate 101 and the second semiconductor nanowires 140 may be formed based on the first well region 105 and the reverse bias, without an additional insulation layer.

Figure 4:
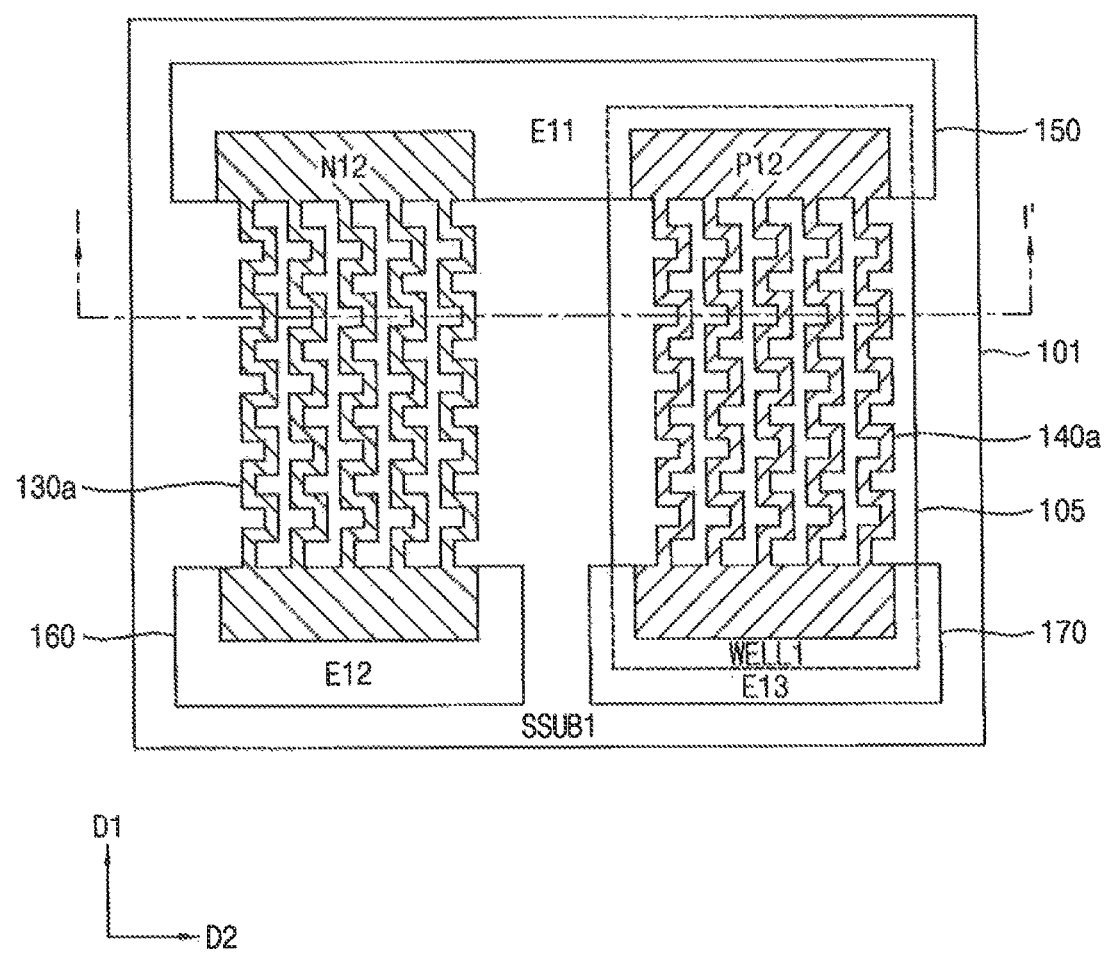
FIG. 4 is a plan view illustrating a thermoelectric element according to exemplary embodiments of the present inventive concept.

FIG. 4 is a plan view illustrating a thermoelectric element according to exemplary embodiments.

Referring to FIGS. 1B and 4, a thermoelectric element 100a includes a semiconductor substrate 101 (SSUB1), a plurality of first semiconductor fin structures 110, a plurality of second semiconductor fin structures 120, a plurality of first semiconductor nanowires 130a (N12), a plurality of second semiconductor nanowires 140a (P12), a first electrode 150 (E11), a second electrode 160 (E12) and a third electrode 170 (E13). The thermoelectric element 100a may further include a first well region 105 (WELL1), a first insulation layer 180 (IL1) and a second insulation layer 190 (IL2).

The thermoelectric element 100a of FIG. 4 may be substantially the same as the thermoelectric element 100 of FIG. 1A, except that shapes of the semiconductor fin structures and the semiconductor nanowires of FIG. 4 are different from the shapes of the semiconductor fin structures and the semiconductor nanowires of FIG. 1A. A cross-sectional view of the thermoelectric element 100a taken along line I-I' of FIG. 4 may be substantially the same as FIG. 1B.

Each of the plurality of first and second semiconductor fin structures 110 and 120 is formed to protrude from the semiconductor substrate 101 and extend in a first direction D1. The plurality of first semiconductor nanowires 130a are formed on the plurality of first semiconductor fin structures 110 and include first impurities. The plurality of second semiconductor nanowires 140a are formed on the plurality of second semiconductor fin structures 120 and include second impurities different from the first impurities.

In some exemplary embodiments, each of the first and second semiconductor fin structures 110 and 120 may extend in the first direction D1 with a zigzag shape, and thus each of the first and second semiconductor nanowires 130a and 140a may also extend in the first direction D1 with the zigzag shape. In this case, the zigzag shape of the semiconductor fin structures 110 and 120 may give mechanical support to themselves, and thus prevent the first and second semiconductor fin structures 110 and 120 from leaning toward the semiconductor substrate 101. For example, a ratio of height to width of a semiconductor fin structure may be such that the semiconductor fin structure leans toward the semiconductor substrate 101 in a manufacturing process. In this case, a zigzag shape of the semiconductor fin structure may prevent the semiconductor fin structure from leaning toward the semiconductor substrate 101.

The first electrode 150 is connected to the first ends of the first semiconductor nanowires 130a and the first ends of the second semiconductor nanowires 140a. The second electrode 160 is connected to the second ends of the first semiconductor nanowires 130a. The third electrode 170 is connected to the second ends of the second semiconductor nanowires 140a.

The first well region 105 may be formed under the second semiconductor fin structures 120 within the semiconductor substrate 101. The first insulation layer 180 may be formed between the first and second semiconductor fin structures 110 and 120 on the semiconductor substrate 101. The second insulation layer 190 may be formed between the first and second semiconductor nanowires 130a and 140a on the first insulation layer 180.

Figure 5A:
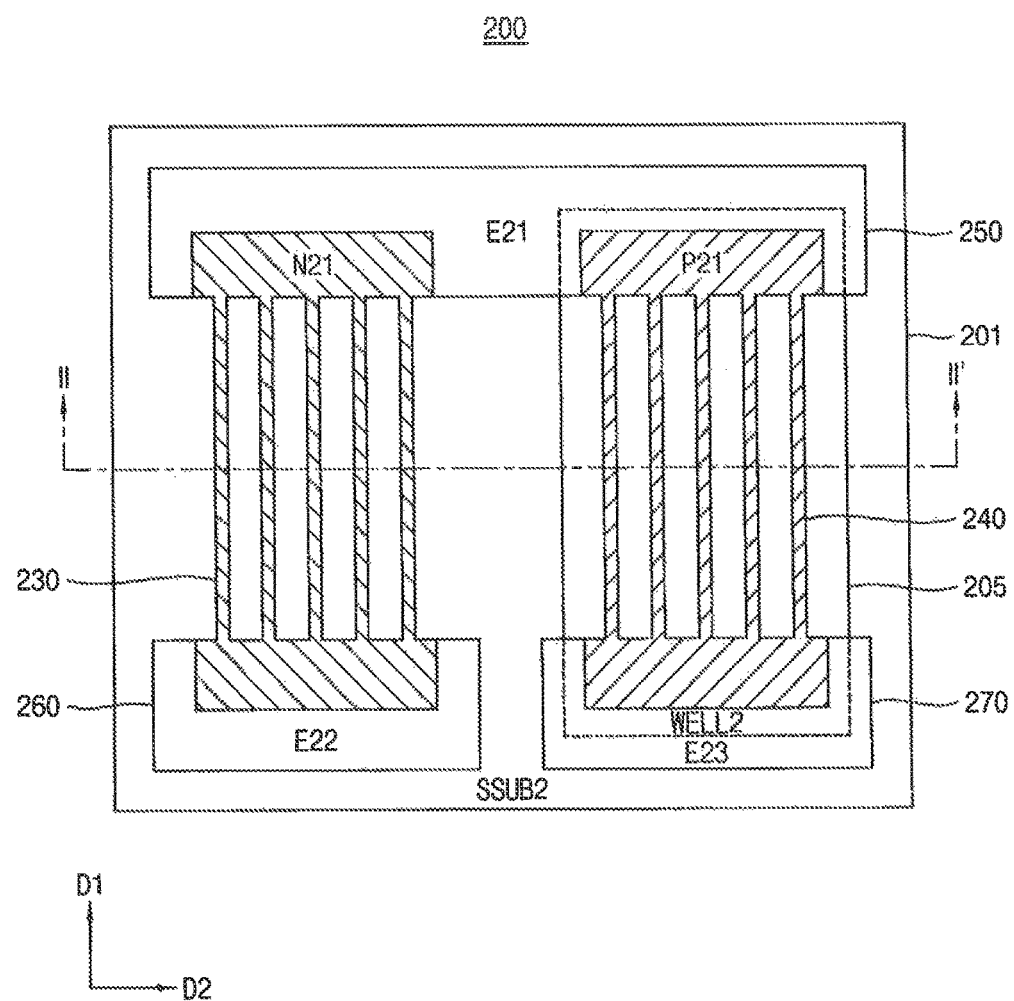
FIGS. 5A and 5B are diagrams illustrating a thermoelectric element according to exemplary embodiments of the present inventive concept.
Figure 5B:
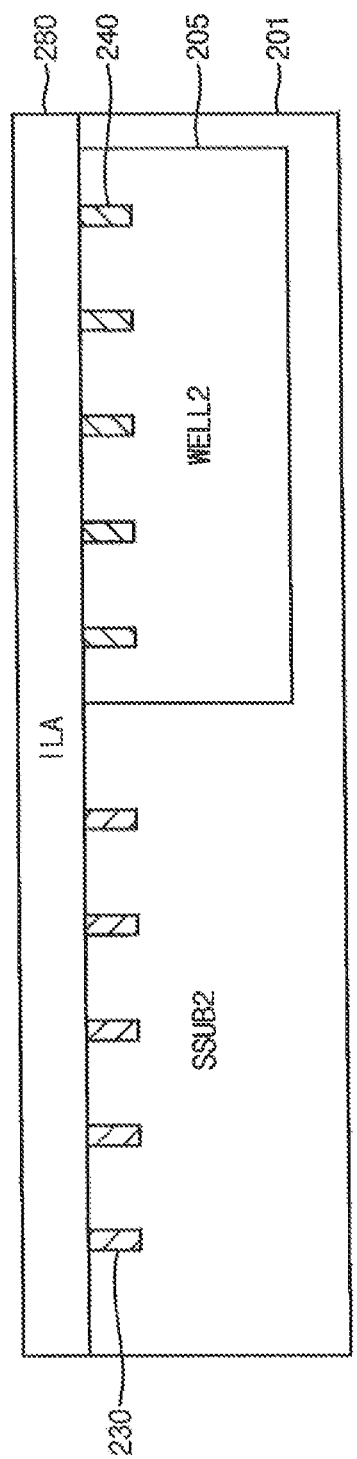

FIGS. 5A and 5B are diagrams illustrating a thermoelectric element according to exemplary embodiments. FIG. 5A is a plan view of the thermoelectric element. FIG. 5B is a cross-sectional view of the thermoelectric element taken along line II-II' of FIG. 5A.

Referring to FIGS. 5A and 5B, a thermoelectric element 200 includes a semiconductor substrate 201 (SSUB2), a plurality of first semiconductor nanowires 230 (N21), a plurality of second semiconductor nanowires 240 (P21), a first electrode 250 (E21), a second electrode 260 (E22) and a third electrode 270 (E23). The thermoelectric element 200 may further include a first well region 205 (WELL2) and a first insulation layer 280 (ILA).

The plurality of first semiconductor nanowires 230 are formed within the semiconductor substrate 201. Each of the first semiconductor nanowires 230 extends in a first direction D1. The plurality of first semiconductor nanowires 230 may be arranged in a second direction D2 crossing (e.g., substantially perpendicular to) the first direction D1. The first semiconductor nanowires 230 include first impurities. For example, the first impurities may be N-type impurities.

The plurality of second semiconductor nanowires 240 are formed within the semiconductor substrate 201 and are spaced apart from the plurality of first semiconductor nanowires 230. Each of the second semiconductor nanowires 240 extends in the first direction D1. The plurality of second semiconductor nanowires 240 may be arranged in the second direction D2. The second semiconductor nanowires 240 include second impurities different from the first impurities. For example, the second impurities may be P-type impurities.

In some exemplary embodiments, each of the first and second semiconductor nanowires 230 and 240 may extend in the first direction D1 with a straight line shape.

As illustrated in FIG. 5A, first ends of the first semiconductor nanowires 230 may be connected to each other, and second ends of the first semiconductor nanowires 230 may be connected to each other. Similarly, first ends of the second semiconductor nanowires 240 may be connected to each other, and second ends of the second semiconductor nanowires 240 may be connected to each other.

The first electrode 250 is connected to the first ends of the first semiconductor nanowires 230 and the first ends of the second semiconductor nanowires 240. The second electrode 260 is connected to the second ends of the first semiconductor nanowires 230. The third electrode 270 is connected to the second ends of the second semiconductor nanowires 240. The first, second and third electrodes 250, 260 and 270 may be formed on the first insulation layer 280.

In some exemplary embodiments, the semiconductor substrate 201 may include a first area and a second area spaced apart from the first area. The first electrode 250 may be disposed in the first area of the semiconductor substrate 201, and the second and third electrodes 260 and 270 may be disposed in the second area of the semiconductor substrate 201. For example, the second area may be farthest from the first area within the semiconductor substrate 201.

The first well region 205 may be formed within the semiconductor substrate 201 and may surround the second semiconductor nanowires 240.

In some exemplary embodiments, the first well region 205 may include the first impurities. The semiconductor substrate 201 may include the second impurities. For example, the first well region 205 and the first semiconductor nanowires 230 may include the same type (e.g., N-type) of impurities. The semiconductor substrate 201 and the second semiconductor nanowires 240 may include the same type (e.g., P-type) of impurities.

In some exemplary embodiments, a doping density of the first semiconductor nanowires 230 may be higher than a doping density of the first well region 205. A doping density of the second semiconductor nanowires 240 may be higher than a doping density of the semiconductor substrate 201. For example, the first well region 205 may be an N-type region, and the first semiconductor nanowires 230 may be an (N+)-type region. The semiconductor substrate 201 may be a P-type region, and the second semiconductor nanowires 240 may be a (P+)-type region.

The first insulation layer 280 may be formed on the semiconductor substrate 201.

The thermoelectric element 200 according to exemplary embodiments may perform one of the horizontal heat distributing operation and the energy generating operation described with reference to FIGS. 3A and 3B.

For example, to perform the horizontal heat distributing operation, a first voltage may be applied to the thermoelectric element 200 through the second and third electrodes 260 and 270. A first current may be induced by the first voltage and may flow through the thermoelectric element 200. A thermoelectric effect may be caused by the first current. For example, heat may be generated at an area near the first electrode 250 (e.g., the first area), and the heat may be horizontally distributed toward an area near the second and third electrodes 260 and 270 (e.g., the second area) by the thermoelectric element 200.

To perform the energy generating operation, a first load may be connected between the second and third electrodes 260 and 270 of the thermoelectric element 200. A thermoelectric effect may be caused by the heat generated in the area near the first electrode E11 (e.g., the first area), thermal energy may be converted into electric energy, and thus a second current may flow through the thermoelectric element 200. A second voltage may be induced by the second current, and power may be collected from the heat. The magnitude of the collected power may be determined based on the second voltage.

In some exemplary embodiments, a reverse bias (e.g., a negative voltage) may be applied to the first well region 205 during performance of the horizontal heat distributing operation or the energy generating operation. An electrical insulation between the semiconductor substrate 201 and the second semiconductor nanowires 240 may be formed based on the first well region 205 and the reverse bias, without an additional insulation layer.

Figure 6A:
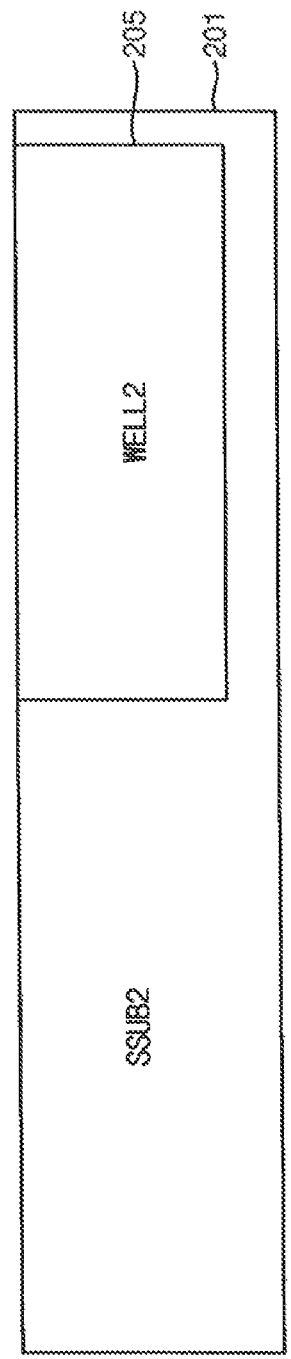
FIGS. 6A and 6B are cross-sectional views for illustrating a method of manufacturing a thermoelectric element according to exemplary embodiments of the present inventive concept.
Figure 6B:
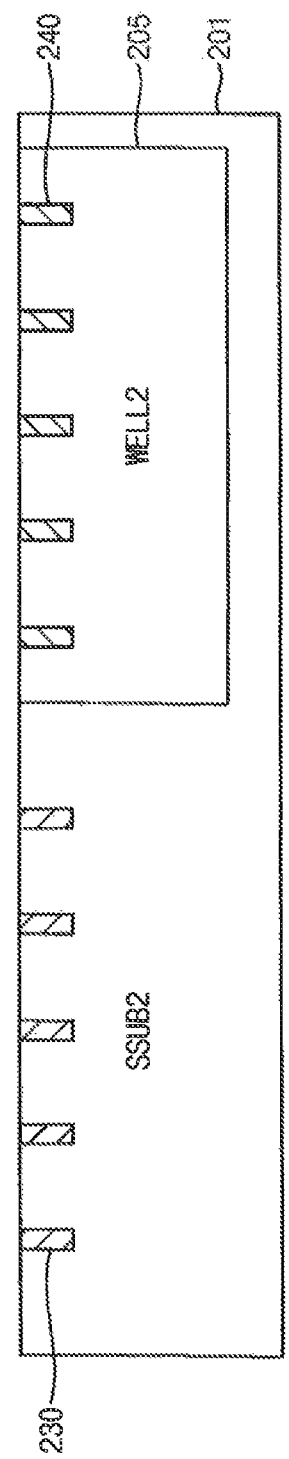

FIGS. 6A and 6B are cross-sectional views of illustrating a method of manufacturing a thermoelectric element according to exemplary embodiments.

Referring to FIG. 6A, the first well region 205 including the first impurities is formed within the semiconductor substrate 201 including the second impurities. For example, a region (e.g., an N-type region) of a conductivity type that is opposite to that of the semiconductor substrate 201 (e.g., a P-type semiconductor substrate) may be formed in the semiconductor substrate 201 using an ion implantation process to form the first well region 205. As will be described below with reference to FIG. 6B, the first well region 205 may be formed to surround the second semiconductor nanowires 240.

Referring to FIG. 6B, the first semiconductor nanowires 230 including the first impurities (e.g., the N-type impurities) are formed within the semiconductor substrate 201, and the second semiconductor nanowires 240 including the second impurities (e.g., the P-type impurities) are formed within the semiconductor substrate 201 (e.g., within the first well region 205). Each of the first and second semiconductor nanowires 230 and 240 extends in the first direction D1. The plurality of first semiconductor nanowires 230 and the plurality of second semiconductor nanowires 240 may be arranged in the second direction D2. For example, regions (e.g., (N+)-type regions) of a conductivity type that is opposite to that of the semiconductor substrate 201 (e.g., P-type semiconductor substrate) may be formed within the semiconductor substrate 201 to form the first semiconductor nanowires 230. Regions (e.g., (P+)-type regions) of a conductivity type that is opposite to that of the first well region 205 (e.g., N-type regions) may be formed within the first well region 205 to form the second semiconductor nanowires 240.

In some exemplary embodiments, a width of each of the first and second semiconductor nanowires 230 and 240 may be substantially equal to or less than about 100 nm. For example, each of the first and second semiconductor nanowires 230 and 240 may have a width of about 50 nm to about 100 nm.

In some exemplary embodiments, the first and second semiconductor nanowires 230 and 240 may be substantially simultaneously or concurrently formed. In other exemplary embodiments, the first and second semiconductor nanowires 230 and 240 may be sequentially formed.

Referring back to FIG. 5B, the first insulation layer 280 is formed on the semiconductor substrate 201 (e.g., on the first and second semiconductor nanowires 230 and 240). For example, the first insulation layer 280 may be formed of at least one of silicon oxide (SiOx), silicon oxynitride (SiOxNy), silicon nitride (SiNx), germanium oxynitride (GeOxNy), germanium silicon oxide (GeSixOy), and high-k dielectric materials including hafnium oxide (HfOx), zirconium oxide (ZrOx), aluminum oxide (AlOx), tantalum oxide (TaOx), hafnium silicate (HfSix), or zirconium silicate (ZrSix).

Referring back to FIG. 5A, the first, second and third electrodes 250, 260 and 270 are formed on the first insulation layer 280. The first electrode 250 is connected to the first ends of the first semiconductor nanowires 230 and the first ends of the second semiconductor nanowires 240. The second electrode 260 is connected to the second ends of the first semiconductor nanowires 230. The third electrode 270 is connected to the second ends of the second semiconductor nanowires 240. For example, the first, second and third electrodes 250, 260 and 270 may include at least one of copper, tungsten, titanium and aluminum.

Figure 7:
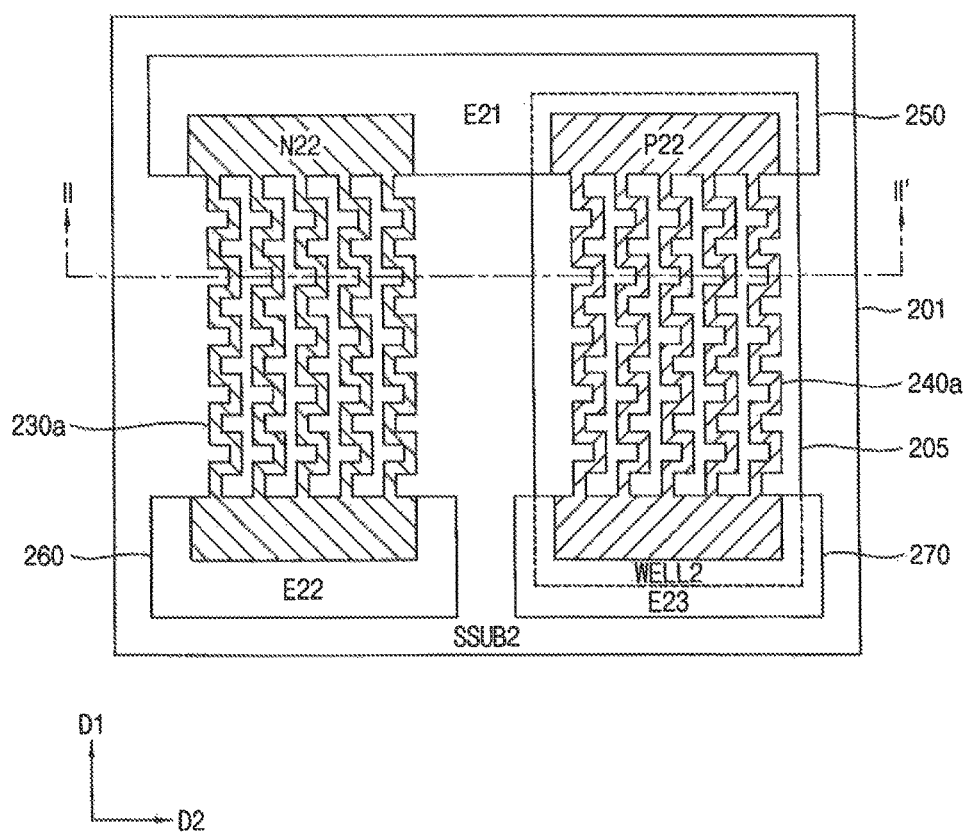
FIG. 7 is a plan view illustrating a thermoelectric element according to exemplary embodiments of the present inventive concept.

FIG. 7 is a plan view illustrating a thermoelectric element according to example embodiments.

Referring to FIGS. 5B and 7, a thermoelectric element 200a includes a semiconductor substrate 201 (SSUB2), a plurality of first semiconductor nanowires 230a (N22), a plurality of second semiconductor nanowires 240a (P22), a first electrode 250 (E21), a second electrode 260 (E22) and a third electrode 270 (E23). The thermoelectric element 200a may further include a first well region 205 (WELL2) and a first insulation layer 280 (ILA).

The thermoelectric element 200a of FIG. 7 may be substantially the same as the thermoelectric element 200 of FIG. 5A, except that shapes of the semiconductor nanowires in FIG. 7 are different from the shapes of the semiconductor nanowires in FIG. 5A. A cross-sectional view of the thermoelectric element 200a taken along line II-II' of FIG. 7 may be substantially the same as FIG. 5B.

The plurality of first semiconductor nanowires 230a is formed within the semiconductor substrate 201 and includes first impurities. Each of the first semiconductor nanowires 230 extends in a first direction D1. The plurality of second semiconductor nanowires 240a is formed within the semiconductor substrate 201, is spaced apart from the plurality of first semiconductor nanowires 230a and includes second impurities different from the first impurities. Each of the second semiconductor nanowires 240a extends in the first direction D1.

In some exemplary embodiments, each of the first and second semiconductor nanowires 230a and 240a may extend in the first direction D1 with a zigzag shape.

The first electrode 250 is connected to the first ends of the first semiconductor nanowires 230a and the first ends of the second semiconductor nanowires 240a. The second electrode 260 is connected to the second ends of the first semiconductor nanowires 230a. The third electrode 270 is connected to the second ends of the second semiconductor nanowires 240a.

The first well region 205 may be formed within the semiconductor substrate 201 and may surround the second semiconductor nanowires 240a. The first insulation layer 280 may be formed on the semiconductor substrate 201.

The thermoelectric element according to exemplary embodiments may include the semiconductor nanowires. For example, the semiconductor nanowires may be formed on three-dimensional (3D) semiconductor structures (e.g., the semiconductor fin structures), as in examples of FIGS. 1A, 1B and 4, or the semiconductor nanowires may be formed using an active layer of a two-dimensional (2D) semiconductor structures, as in examples of FIGS. 5A, 5B and 7. Accordingly, the on-die thermoelectric element that can be integrated within a semiconductor device may be manufactured in various structures.

Figure 8A:
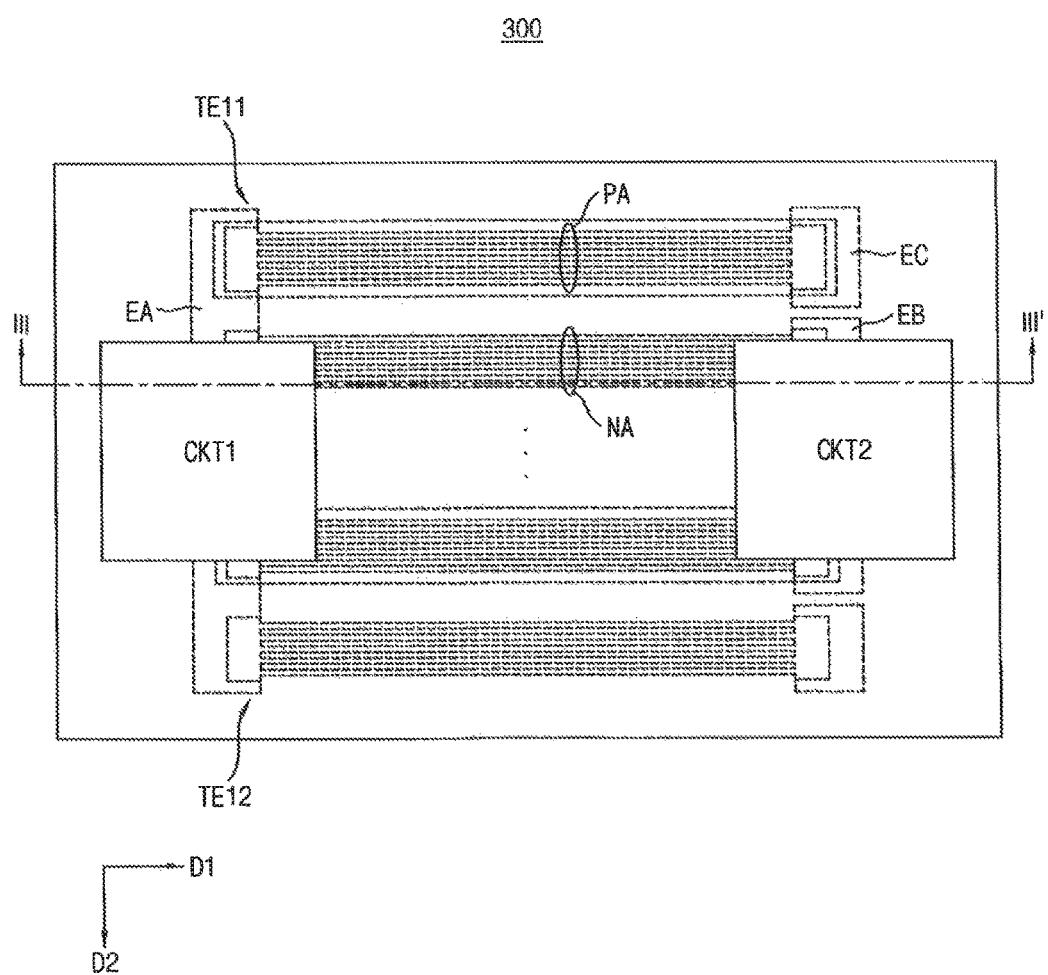
FIGS. 8A and 8B are diagrams illustrating a semiconductor device according to exemplary embodiments of the present inventive concept.
Figure 8B:
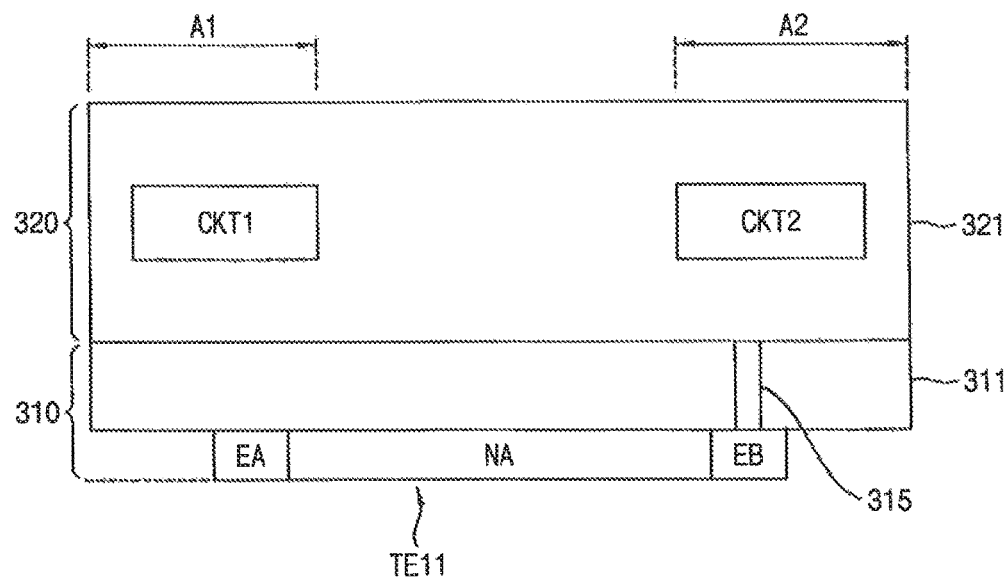

FIGS. 8A and 8B are diagrams illustrating a semiconductor device according to exemplary embodiments. FIG. 8A is a plan view of the semiconductor device. FIG. 8B is a cross-sectional view of the semiconductor device taken along line III-III' of FIG. 8A.

Referring to FIGS. 8A and 8B, a semiconductor device 300 includes a first semiconductor die 310 and a second semiconductor die 320.

The first semiconductor die 310 includes a first thermoelectric element TE11 that is formed on a first semiconductor substrate 311. The first semiconductor die 310 may further include a plurality of thermoelectric elements including a second thermoelectric element TE12.

The first thermoelectric element TE11 may be one of the thermoelectric element 100 of FIGS. 1A and 1B, the thermoelectric element 100a of FIG. 4, the thermoelectric element 200 of FIGS. 5A and 5B and the thermoelectric element 200a of FIG. 7. For example, as will be described with reference to FIGS. 12 through 14, the first thermoelectric element TE11 includes a plurality of first semiconductor nanowires NA, a plurality of second semiconductor nanowires PA, a first electrode EA, a second electrode EB and a third electrode EC. The plurality of first semiconductor nanowires NA is formed within or on the first semiconductor substrate 311. Each of the first semiconductor nanowires NA extends in a first direction D1 and includes first impurities. The plurality of second semiconductor nanowires PA are formed within or on the first semiconductor substrate 311, and are spaced apart from the plurality of first semiconductor nanowires NA. Each of the second semiconductor nanowires PA extends in the first direction D1 and includes second impurities different from the first impurities. The first electrode EA is connected to first ends of the first semiconductor nanowires NA and first ends of the second semiconductor nanowires PA. The second electrode EB is connected to second ends of the first semiconductor nanowires NA. The third electrode EC is connected to second ends of the second semiconductor nanowires PA.

In some exemplary embodiments, when the first and second semiconductor nanowires NA and PA are formed on the first semiconductor substrate 311, the first thermoelectric element TE11 may further include a plurality of first semiconductor fin structures, a plurality of second semiconductor fin structures and a first well region. As described above with reference to FIGS. 1A, 1B and 4, each of the plurality of first and second semiconductor fin structures may be formed to protrude from the first semiconductor substrate 311 and may extend in the first direction D1. The first well region may be formed under the second semiconductor fin structures within the first semiconductor substrate 311. The first semiconductor nanowires NA may be formed on the first semiconductor fin structures, and the second semiconductor nanowires PA may be formed on the second semiconductor fin structures.

In other exemplary embodiments, when the first and second semiconductor nanowires NA and PA are formed within the first semiconductor substrate 311, the first thermoelectric element TE11 may further include a first well region. As described above with reference to FIGS. 5A, 5B and 7, the first well region may be formed within the first semiconductor substrate 311 and may surround the second semiconductor nanowires PA.

Each of the plurality of thermoelectric elements including the second thermoelectric element TE12 may have a structure substantially the same as that of the first thermoelectric element TE11. For example, as will be described with reference to FIGS. 12 through 14, the second thermoelectric element TE12 may include a plurality of third semiconductor nanowires ND, a plurality of fourth semiconductor nanowires PD, a fourth electrode ED, a fifth electrode EE and a sixth electrode EF. The plurality of third semiconductor nanowires ND may be formed within or on the first semiconductor substrate 311. Each of the third semiconductor nanowires ND may extend in the first direction D1 and may include the first impurities. The plurality of fourth semiconductor nanowires PD may be formed within or on the first semiconductor substrate 311, and may be spaced apart from the plurality of third semiconductor nanowires ND. Each of the fourth semiconductor nanowires PD may extend in the first direction D1 and may include the second impurities. The fourth electrode ED may be connected to first ends of the third semiconductor nanowires ND and first ends of the fourth semiconductor nanowires PD. The fifth electrode EE may be connected to second ends of the third semiconductor nanowires ND. The sixth electrode EF may be connected to second ends of the fourth semiconductor nanowires PD.

As described above with reference to FIGS. 3A and 3B, each of the plurality of thermoelectric elements including the first and second thermoelectric elements TE11 and TE12 may perform one of the horizontal heat distributing operation and the energy generating operation. In some exemplary embodiments, the plurality of thermoelectric elements may be or may not be electrically connected to each other. Detailed electrical connections of the plurality of thermoelectric elements will be described with reference to FIGS. 12, 13 and 14.

The second semiconductor die 320 is formed on the first semiconductor die 310 and includes a first area A1 and a second area A2. For example, the second area A2 may be farthest from the first area A1 within the second semiconductor die 320.

The second semiconductor die 320 may include a first circuit CKT1 and a second circuit CKT2. The first circuit CKT1 may be disposed in a second semiconductor substrate 321 and may be disposed in the first area A1. The second circuit CKT2 may be disposed in the second semiconductor substrate 321 and may be disposed in the second area A2. Each of the first circuit CKT1 and the second circuit CKT2 may include a plurality of active elements and/or a plurality of passive elements.

The first area A1 may include a hot spot, which is an area that locally generates a greatest amount of heat within the semiconductor device 300. A temperature of the first area A1 may be higher than a temperature of the second area A2 during a period when the semiconductor device 300 operates. For example, the first circuit CKT1 in the first area A1 may include a central processing unit (CPU), an application processor (AP), etc., and the second circuit CKT2 in the second area A2 may include a peripheral circuit, etc. For another example, the number of active and/or passive elements in the first circuit CKT1 may be greater than the number of active and/or passive elements in the second circuit CKT2.

The plurality of thermoelectric elements may be formed between the first area A1 and the second area A2 and may partially overlap the first area A1 and the second area A2.

In some exemplary embodiments, the semiconductor device 300 may further include at least one through silicon via (TSV) 315. The first semiconductor die 310 and the second semiconductor die 320 may be electrically connected to each other using the at least one TSV 315. For example, voltages may be applied from the second semiconductor die 320 to the plurality of thermoelectric elements through the at least one TSV 315. Power obtained by the plurality of thermoelectric elements may be provided to the second semiconductor die 320 through the at least one TSV 315.

In some exemplary embodiments, the semiconductor device 300 may further include a controller 350 that will be described with reference to FIG. 10.

Figure 9A:
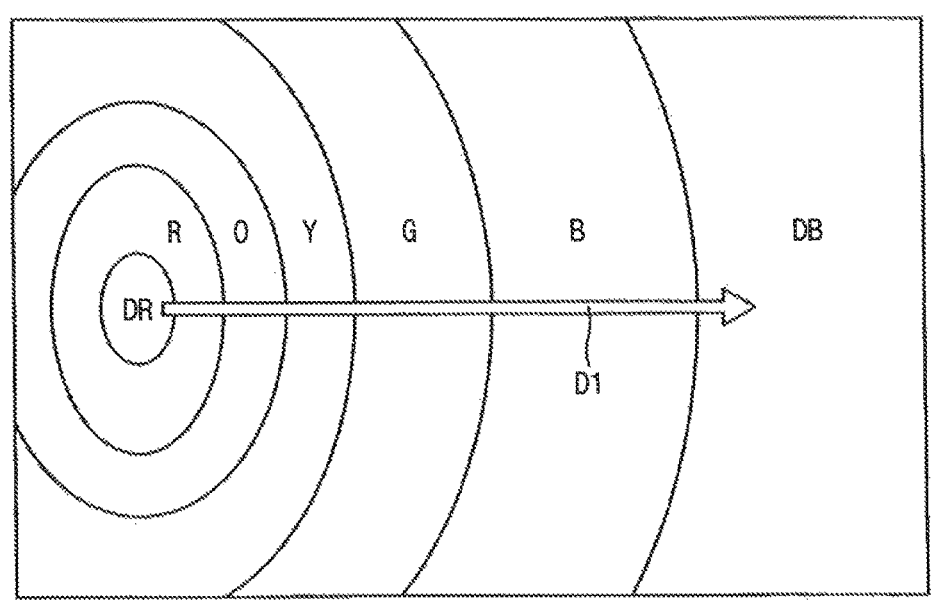
FIGS. 9A and 9B are diagrams for illustrating an operation of the semiconductor device of FIGS. 8A and 8B according to exemplary embodiments of the present inventive concept.
Figure 9B:
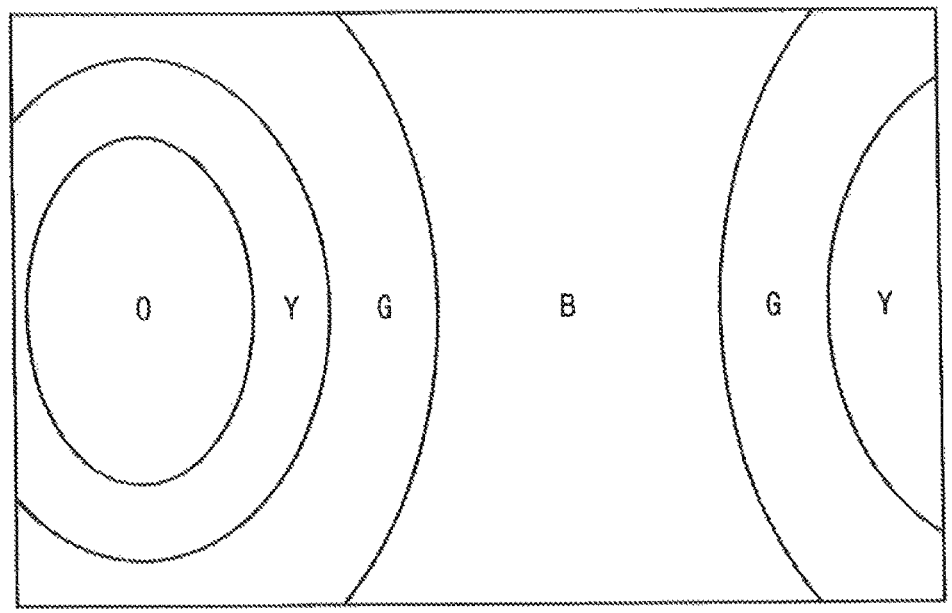

FIGS. 9A and 9B are diagrams for illustrating an operation of the semiconductor device of FIGS. 8A and 8B. FIGS. 9A and 9B are plan views of the change in temperature of the semiconductor device due to the horizontal heat distributing operation. In FIGS. 9A and 9B, "DR" represents dark red, "R" represents red, "O" represents orange, "Y" represents yellow, "G" represents green, "B" represents blue, and "DB" represents dark blue. A red area may have a relatively high temperature, and a blue area may have a relatively low temperature. An area with a color closer to red may have a temperature higher than a temperature of an area with a color closer to blue.

Referring to FIGS. 8A, 8B and 9A, before performing the horizontal heat distributing operation, the first area A1 (e.g., left-side area) of the semiconductor device 300 may have a relatively high temperature and the second area A2 (e.g., right-side area) of the semiconductor device 300 may have a relatively low temperature. For example, the first area A1 may include the hot spot, and there may be a relatively large temperature difference between the first area A1 and the second area A2. In the horizontal heat distributing operation, the heat generated by the first area A1 may be transferred from the first area A1 to the second area A2 in the first direction D1.

Referring to FIGS. 8A, 8B and 9B, after performing the horizontal heat distributing operation, there may be a relatively small temperature difference between the first area A1 and the second area A2. For example, the temperature of the first area A1 in FIG. 9B may lower than the temperature of the first area A1 in FIG. 9A, and the temperature of the second area A2 in FIG. 9B may be higher than the temperature of the second area A2 in FIG. 9A. Since the heat is transferred, by the horizontal heat distributing operation, from the first area A1 to the second area A2 within the semiconductor device 300, a total average temperature of the semiconductor device 300 in FIG. 9B, i.e., after the horizontal heat distributing operation has been performed, may be substantially the same as a total average temperature of the semiconductor device 300 in FIG. 9A, i.e., before the horizontal heat distributing operation was performed.

Figure 10:
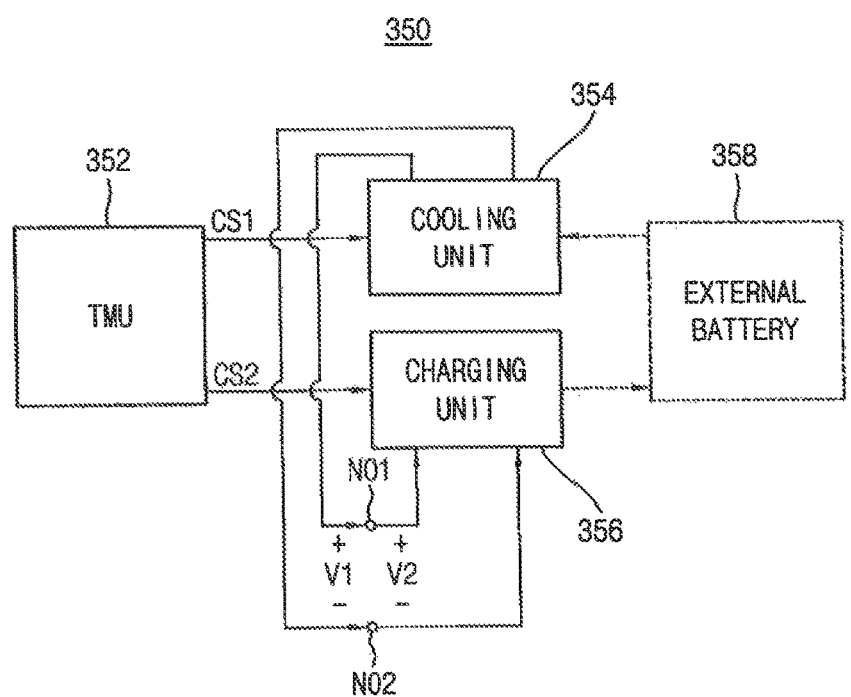
FIG. 10 is a block diagram illustrating a controller included in a semiconductor device according to exemplary embodiments of the present inventive concept.

FIG. 10 is a block diagram illustrating a controller included in the semiconductor device according to exemplary embodiments.

Referring to FIGS. 8A and 10, a controller 350 may include a thermal management unit 352, a cooling unit 354 and a charging unit 356.

The thermal management unit 352 may generate a first control signal CS1 and a second control signal CS2. In some exemplary embodiments, the thermal management unit 352 may generate the first and second control signals CS1 and CS2 based on a first temperature and a second temperature. The first temperature may indicate a temperature of the first area A1 in the semiconductor device 300 that is measured by a first temperature sensor (not illustrated). The second temperature may indicate a temperature of the second area A2 in the semiconductor device 300 that is measured by a second temperature sensor (not illustrated). In other exemplary embodiments, the thermal management unit 352 may generate the first and second control signals CS1 and CS2 based on a trigger signal. The trigger signal may be activated when the semiconductor device 300 is expected to overheat. For example, the trigger signal may be activated when a workload of the semiconductor device 300 is greater than a reference workload.

The cooling unit 354 may provide the first voltage V1 to the thermoelectric elements in the semiconductor device 300 based on the first control signal CS1. For example, the first voltage V1 may be received from an external battery 358 and may be applied to the first thermoelectric element TE11 through first and second nodes NO1 and NO2 and the second and third electrodes E12 and E13 of the first thermoelectric element TE11.

The charging unit 356 may collect the power generated by the energy generating operation based on the second control signal CS2. For example, the charging unit 356 may receive the second voltage V2, which corresponds to the power, through the first and second nodes NO1 and NO2. The external battery 358 may be recharged based on the second voltage V2. Although not illustrated in FIG. 10, the charging unit 356 may directly provide the second voltage V2 to the first and second circuits CKT1 and CKT2 included in the second semiconductor die 320.

Figure 11A:
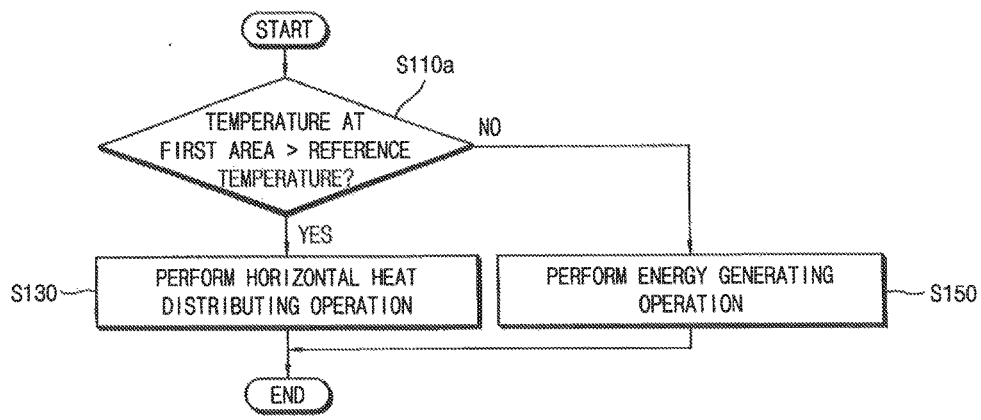
FIGS. 11A and 11B are flow charts for illustrating an operation of the controller of FIG. 10 according to exemplary embodiments of the present inventive concept.
Figure 11B:
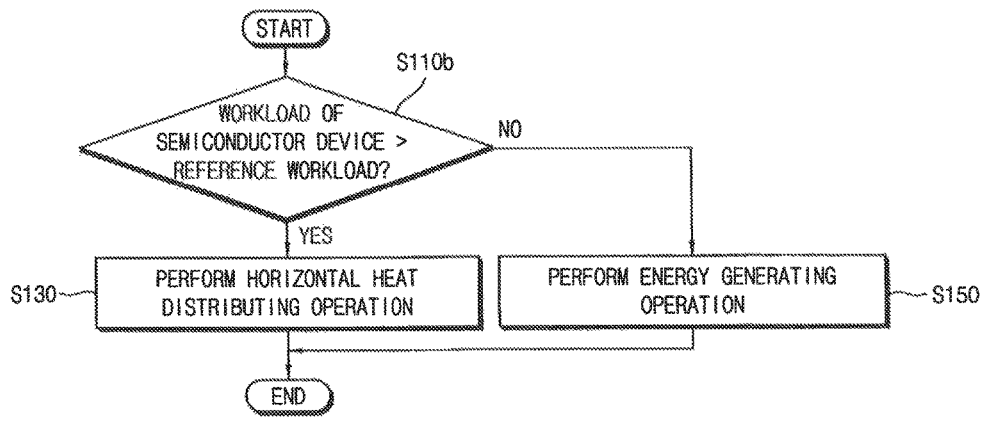

FIGS. 11A and 11B are flow charts for illustrating an operation of the controller of FIG. 10 according to exemplary embodiments.

Referring to FIGS. 10 and 11A, the thermal management unit 352 may compare the first temperature at the first area A1 with the reference temperature (step S110a). If the first temperature is greater than the reference temperature (step S110a: YES), the thermal management unit 352 may activate the first control signal CS1. The cooling unit 354 may be enabled in response to the activated first control signal CS1, and the semiconductor device 300 may operate in a first operation mode. The plurality of thermoelectric elements in the semiconductor device 300 may perform the horizontal heat distributing operation to horizontally distribute the heat generated at the first area A1 to the second area A2 (step S130). The horizontal heat distributing operation may be substantially similar to those described above with reference to FIGS. 3A, 9A and 9B.

When the first temperature is equal to or less than the reference temperature (step S110a: NO), the thermal management unit 352 may activate the second control signal CS2. The charging unit 356 may be enabled in response to the activated second control signal CS2, and the semiconductor device 300 may operate in a second operation mode. The plurality of thermoelectric elements in the semiconductor device 300 may perform the energy generating operation to generate the power from the heat generated at the first area A1 (step S150). The energy generating operation may be substantially similar to that described above with reference to FIG. 3B.

Referring to FIGS. 10 and 11B, the thermal management unit 352 may compare the workload of the semiconductor device 300 with the reference workload (step S110b). If the workload of the semiconductor device 300 is greater than the reference workload, e.g., if the trigger signal is activated (step S110b: YES), the thermal management unit 352 may activate the first control signal CS1. The cooling unit 354 may be enabled in response to the activated first control signal CS1, and the plurality of thermoelectric elements in the semiconductor device 300 may perform the horizontal heat distributing operation to horizontally distribute the heat generated at the first area A1 to the second area A2 (step S130).

If the workload of the semiconductor device 300 is equal to or less than the reference workload, e.g., if the trigger signal is deactivated (step S110b: NO), the thermal management unit 352 may activate the second control signal CS2. The charging unit 356 may be enabled in response to the activated second control signal CS2, and the plurality of thermoelectric elements in the semiconductor device 300 may perform the energy generating operation to generate the power from the heat generated from the first area A1 (step S150).

According to exemplary embodiments, an operation mode of the semiconductor device 300 may change based on a combination of examples described above with reference to FIGS. 11A and 11B. For example, the first operation mode may be enabled when the first temperature at the first area A1 is higher than a reference temperature, as in an example of FIG. 11A, or when the workload of the semiconductor device 300 is greater than the reference workload, as in an example of FIG. 11B. The second operation mode may be enabled when the first operation mode is disabled. According to example embodiments, there may be various criteria for changing the operation mode of the semiconductor device 300.

Figure 12:
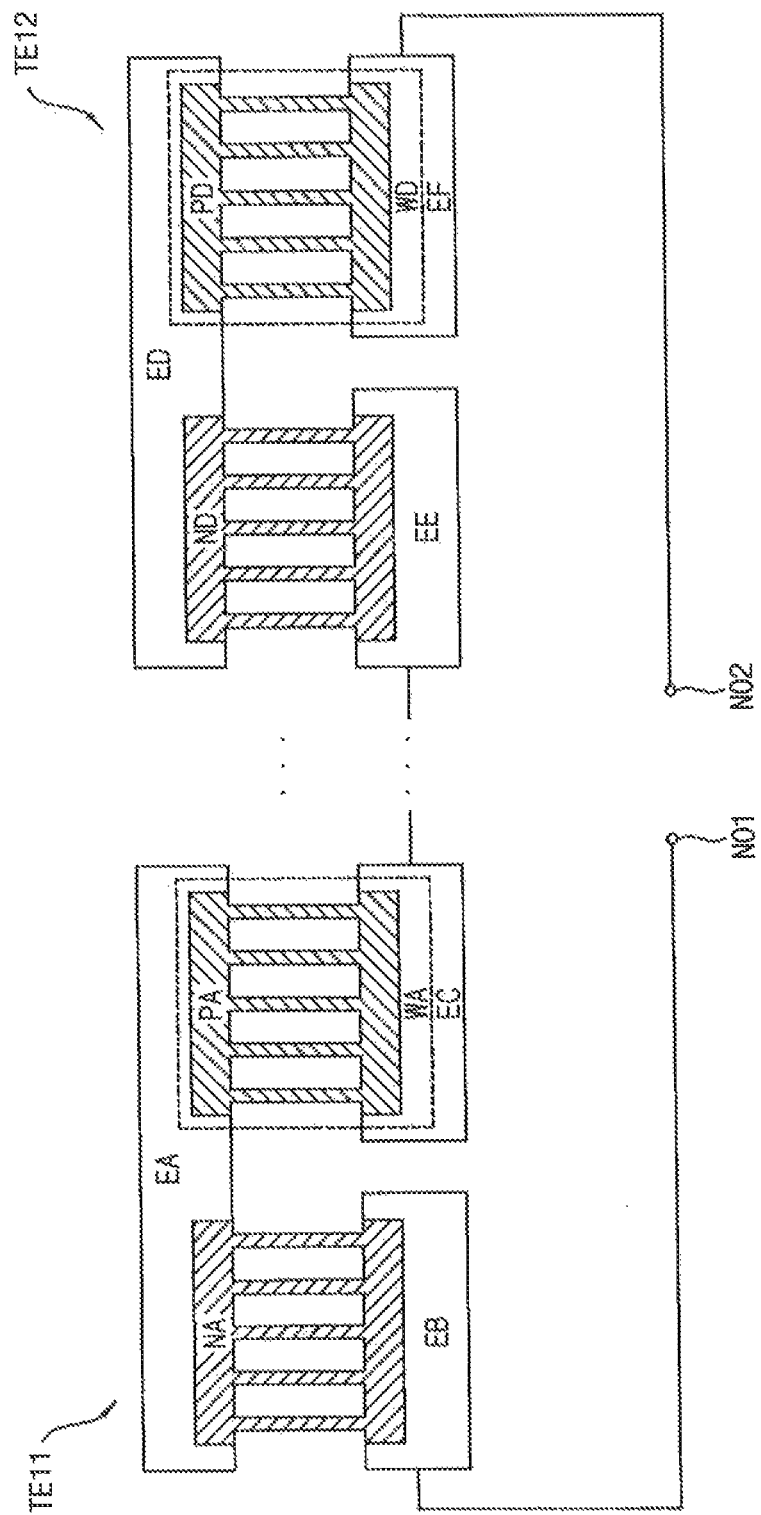
FIGS. 12, 13 and 14 are diagrams for illustrating electrical connections of thermoelectric elements included in the semiconductor device of FIGS. 8A and 8B according to exemplary embodiments of the present inventive concept.
Figure 13:
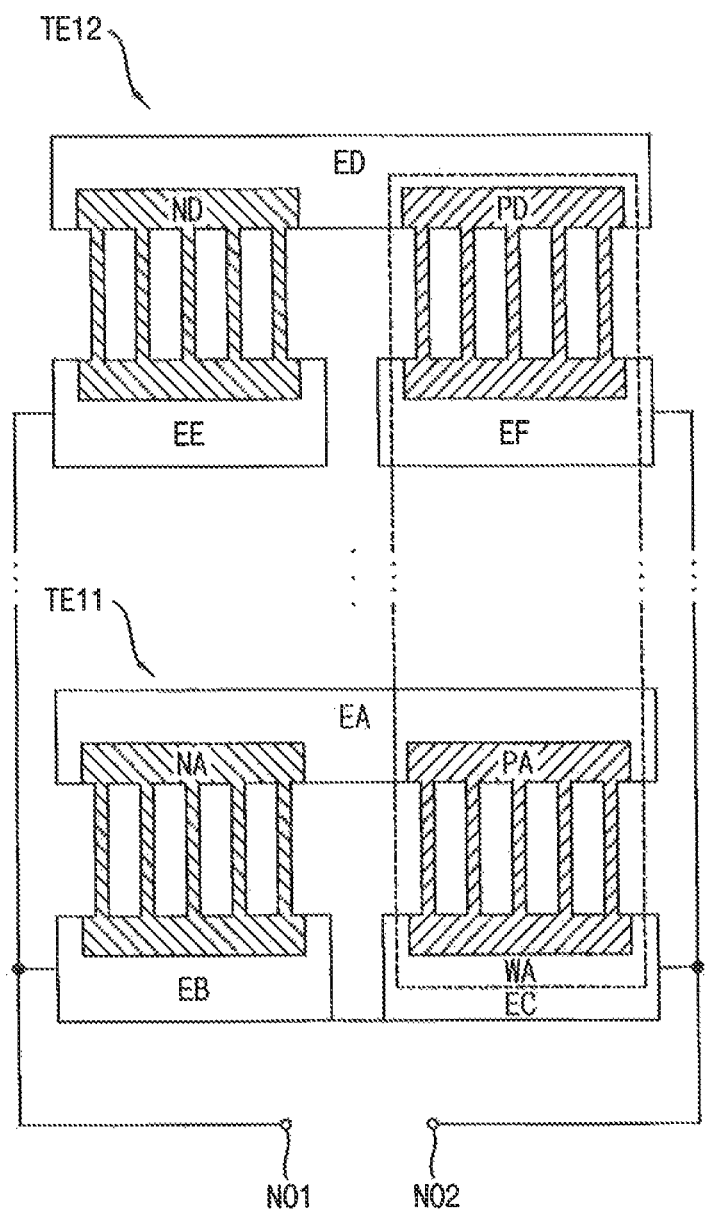
Figure 14:
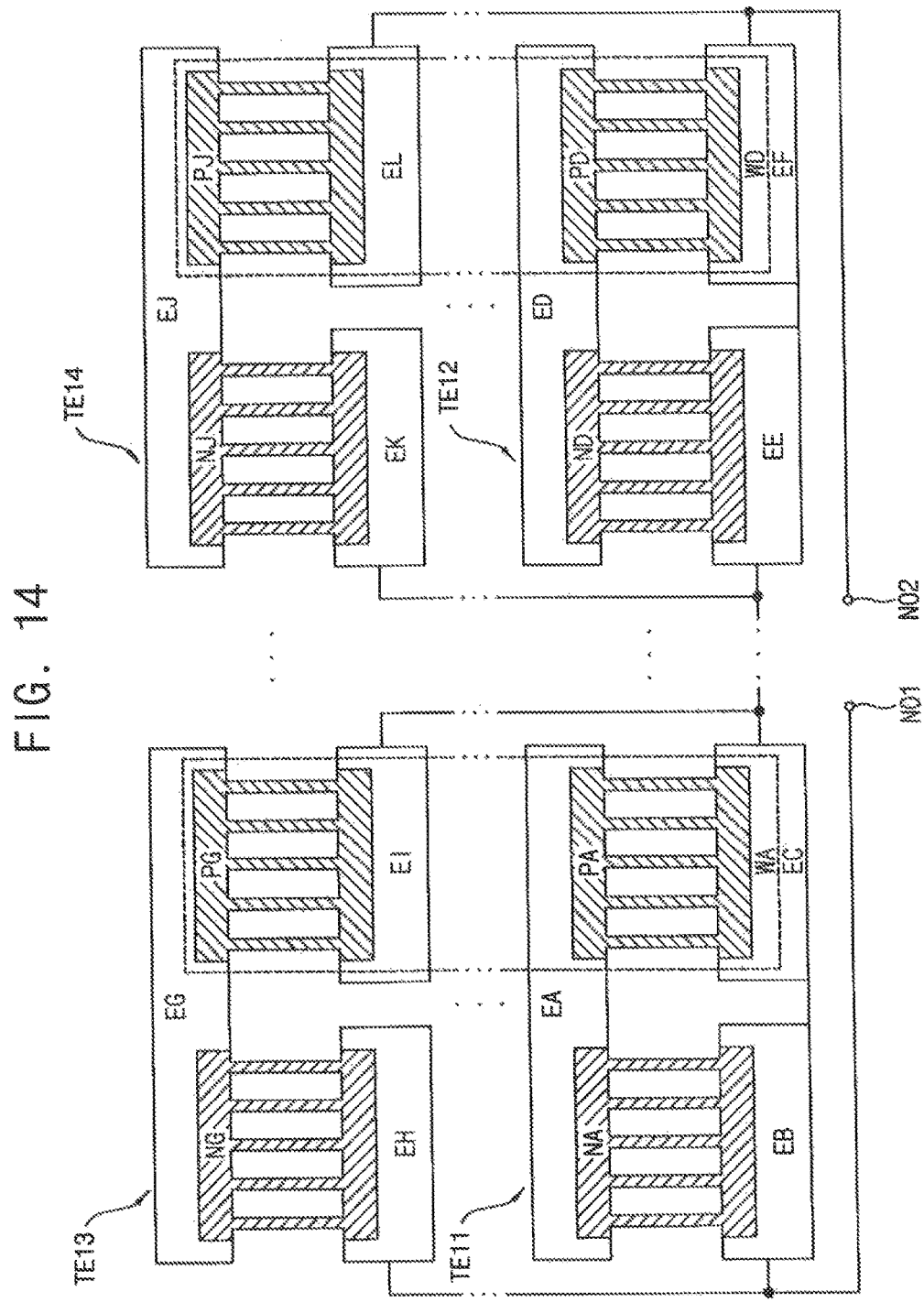

FIGS. 12, 13 and 14 are diagrams for illustrating electrical connections of thermoelectric elements included in the semiconductor device of FIGS. 8A and 8B according to exemplary embodiments.

Referring to FIG. 12, a plurality of thermoelectric elements may include first and second thermoelectric elements TE11 and TE12. The first thermoelectric element TE11 may include a plurality of first semiconductor nanowires NA, a plurality of second semiconductor nanowires PA, a first electrode EA, a second electrode EB and a third electrode EC and may further include a first well region WA. The second thermoelectric element TE12 may include a plurality of third semiconductor nanowires ND, a plurality of fourth semiconductor nanowires PD, a fourth electrode ED, a fifth electrode EE and a sixth electrode EF and may further include a second well region WD.

The thermoelectric elements are connected in series with each other (e.g., a series connection). For example, the second electrode EB of the first thermoelectric element TE11 may be connected to a first node NO1, the third electrode EC of the first thermoelectric element TE11 may be electrically connected to the fifth electrode EE of the second thermoelectric element TE12, and the sixth electrode EF of the second thermoelectric element TE12 may be connected to a second node NO2. A voltage for performing the horizontal heat distributing operation may be applied to the plurality of thermoelectric elements through the first and second nodes NO1 and NO2, or power obtained by the energy generating operation may be received from the plurality of thermoelectric elements through the first and second nodes NO1 and N02.

Referring to FIG. 13, a plurality of thermoelectric elements may include first and second thermoelectric elements TE11 and TE12. The first thermoelectric element TE11 may include a plurality of first semiconductor nanowires NA, a plurality of second semiconductor nanowires PA, a first electrode EA, a second electrode EB and a third electrode EC. The second thermoelectric element TE12 may include a plurality of third semiconductor nanowires ND, a plurality of fourth semiconductor nanowires PD, a fourth electrode ED, a fifth electrode EE and a sixth electrode EF. A first well region WA may be shared by the first and second thermoelectric elements TE11 and TE12.

In FIG. 13, the thermoelectric elements are connected in parallel with each other (e.g., a parallel connection). For example, the second electrode EB of the first thermoelectric element TE11 may be electrically connected to the fifth electrode EE of the second thermoelectric element TE12. The third electrode EC of the first thermoelectric element TE11 may be electrically connected to the sixth electrode EF of the second thermoelectric element TE12. The second electrode EB of the first thermoelectric element TE11 may be connected to a first node NO1, and the third electrode EC of the first thermoelectric element TE11 may be connected to a second node NO2. A voltage for performing the horizontal heat distributing operation may be applied to the plurality of thermoelectric elements through the first and second nodes NO1 and NO2, or power obtained by the energy generating operation may be received from the plurality of thermoelectric elements through the first and second nodes NO1 and NO2.

Referring to FIG. 14, a plurality of thermoelectric elements may include first, second, third and fourth thermoelectric elements TE11, TE12, TE13 and TE14. The first thermoelectric element TE11 may include a plurality of first semiconductor nanowires NA, a plurality of second semiconductor nanowires PA, a first electrode EA, a second electrode EB and a third electrode EC. The second thermoelectric element TE12 may include a plurality of third semiconductor nanowires ND, a plurality of fourth semiconductor nanowires PD, a fourth electrode ED, a fifth electrode EE and a sixth electrode EF. The third thermoelectric element TE13 may include a plurality of fifth semiconductor nanowires NG, a plurality of sixth semiconductor nanowires PG, a seventh electrode EG, a eighth electrode EH and a ninth electrode EI. The fourth thermoelectric element TE14 may include a plurality of seventh semiconductor nanowires NJ, a plurality of eighth semiconductor nanowires PJ, a tenth electrode EJ, a eleventh electrode EK and a twelfth electrode EL. A first well region WA may be shared by the first and third thermoelectric elements TE11 and TE13. A second well region WD may be shared by the second and fourth thermoelectric elements TE12 and TE14.

In FIG. 14, the plurality of thermoelectric elements are connected in a mixed connection of parallel connections and series connections. For example, the first thermoelectric element TE11 may be connected to the second thermoelectric element TE12 based on the parallel structure, as in an example of FIG. 12. The first thermoelectric element TE11 may be connected in parallel to the third thermoelectric element TE13, as the parallel connections of FIG. 13. Similarly, the second thermoelectric element TE12 may be connected in parallel to the fourth thermoelectric element TE14. The two parallel connected thermoelectric elements TE11 and TE13 may be connected in series to another two parallel connected thermoelectric elements TE12 and TE14.

Figure 15A:
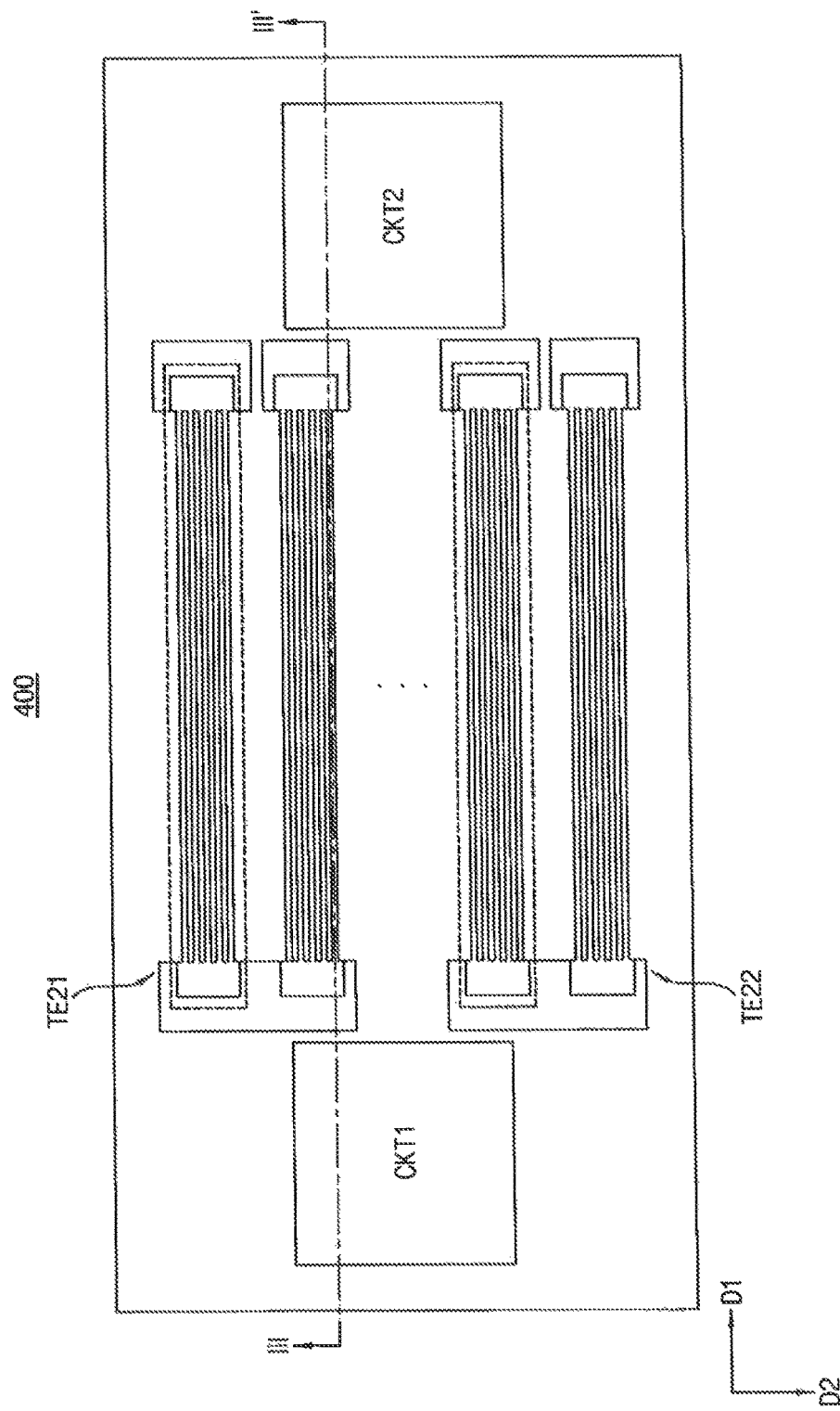
FIGS. 15A and 15B are diagrams illustrating a semiconductor device according to exemplary embodiments of the present inventive concept.
Figure 15B:
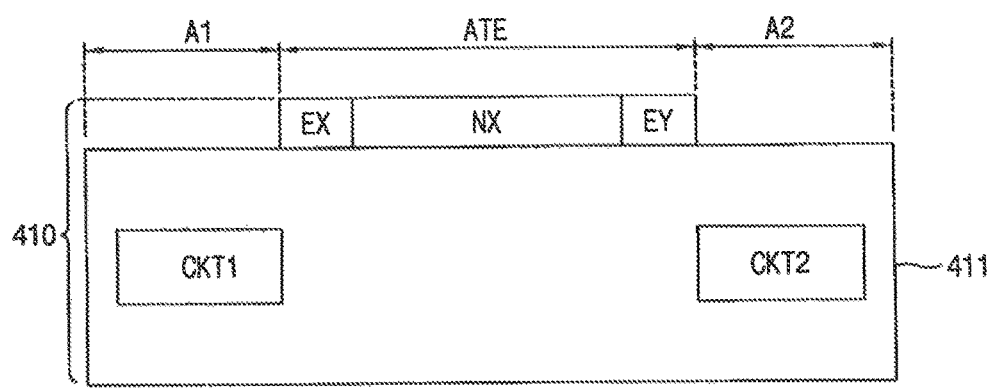

FIGS. 15A and 15B are diagrams illustrating a semiconductor device according to exemplary embodiments. FIG. 15A is a plan view of the semiconductor device. FIG. 15B is a cross-sectional view of the semiconductor device taken along line III-III' of FIG. 15A.

Referring to FIGS. 15A and 15B, a semiconductor device 400 includes a first semiconductor die 410.

The first semiconductor die 410 includes a semiconductor substrate 411, a first thermoelectric element TE21 and a first circuit CKT1 that includes a plurality of active elements and a plurality of passive elements. The first semiconductor die 410 may further include a second circuit CKT2 and a plurality of thermoelectric elements including a second thermoelectric element TE22.

The semiconductor substrate 411 includes a first area A1, a second area ATE adjacent to the first area A1 and a third area A2 spaced apart from the first area A1. For example, the third area A2 may be farthest from the first area A1 within the second semiconductor substrate 411. The second area ATE may be disposed between the first area A1 and the third area A2.

The first circuit CKT1 may be disposed in the semiconductor substrate 411 and may be disposed in the first area A1. The second circuit CKT2 may be disposed in the semiconductor substrate 411 and may be disposed in the third area A2. The second circuit CKT2 may also include a plurality of active elements and a plurality of passive elements.

The first area A1 may include a hot spot, which is an area that locally generates the greatest amount of heat within the semiconductor device 400. A temperature of the first area A1 may be higher than a temperature of the third area A2 in the operation of the semiconductor device 400.

The first thermoelectric element TE21 is formed in the second area ATE of the semiconductor substrate 411. The first thermoelectric element TE21 may be one of the thermoelectric element 100 of FIGS. 1A and 1B, the thermoelectric element 100a of FIG. 4, the thermoelectric element 200 of FIGS. 5A and 5B and the thermoelectric element 200a of FIG. 7. For example, the first thermoelectric element TE21 includes a plurality of first semiconductor nanowires NX, a plurality of second semiconductor nanowires, a first electrode EX, a second electrode EY and a third electrode. The plurality of first semiconductor nanowires NX is formed within or on the first semiconductor substrate 411. Each of the first semiconductor nanowires NX extends in a first direction D1 and includes first impurities. The plurality of second semiconductor nanowires are formed within or on the first semiconductor substrate 411, and are spaced apart from the plurality of first semiconductor nanowires NX. Each of the second semiconductor nanowires extends in the first direction D1 and includes second impurities different from the first impurities. The first electrode EX is connected to first ends of the first semiconductor nanowires NX and first ends of the second semiconductor nanowires. The second electrode EY is connected to second ends of the first semiconductor nanowires NX. The third electrode is connected to second ends of the second semiconductor nanowires.

In some exemplary embodiments, when the first and second semiconductor nanowires are formed on the semiconductor substrate 411, the first thermoelectric element TE21 may further include a plurality of first semiconductor fin structures, a plurality of second semiconductor fin structures and a first well region, as the exemplary embodiments described with reference to FIGS. 1A, 1B and 4. In other exemplary embodiments, when the first and second semiconductor nanowires are formed within the semiconductor substrate 411, the first thermoelectric element TE21 may further include a first well region, as the exemplary embodiments described with reference to FIGS. 5A, 5B and 7.

Each of the plurality of thermoelectric elements including the second thermoelectric element TE22 may have a structure substantially the same as that of the first thermoelectric element TE21. For example, the second thermoelectric element TE22 may include a plurality of third semiconductor nanowires, a plurality of fourth semiconductor nanowires, a fourth electrode, a fifth electrode and a sixth electrode.

As described above with reference to FIGS. 3A and 3B, each of the plurality of thermoelectric elements including the first and second thermoelectric elements TE21 and TE22 may perform one of the horizontal heat distributing operation and the energy generating operation. In some exemplary embodiments, the plurality of thermoelectric elements may be or need not be electrically connected to each other.

In some exemplary embodiments, the semiconductor device 400 may further include the controller 350 of FIG. 10.

Figure 16:
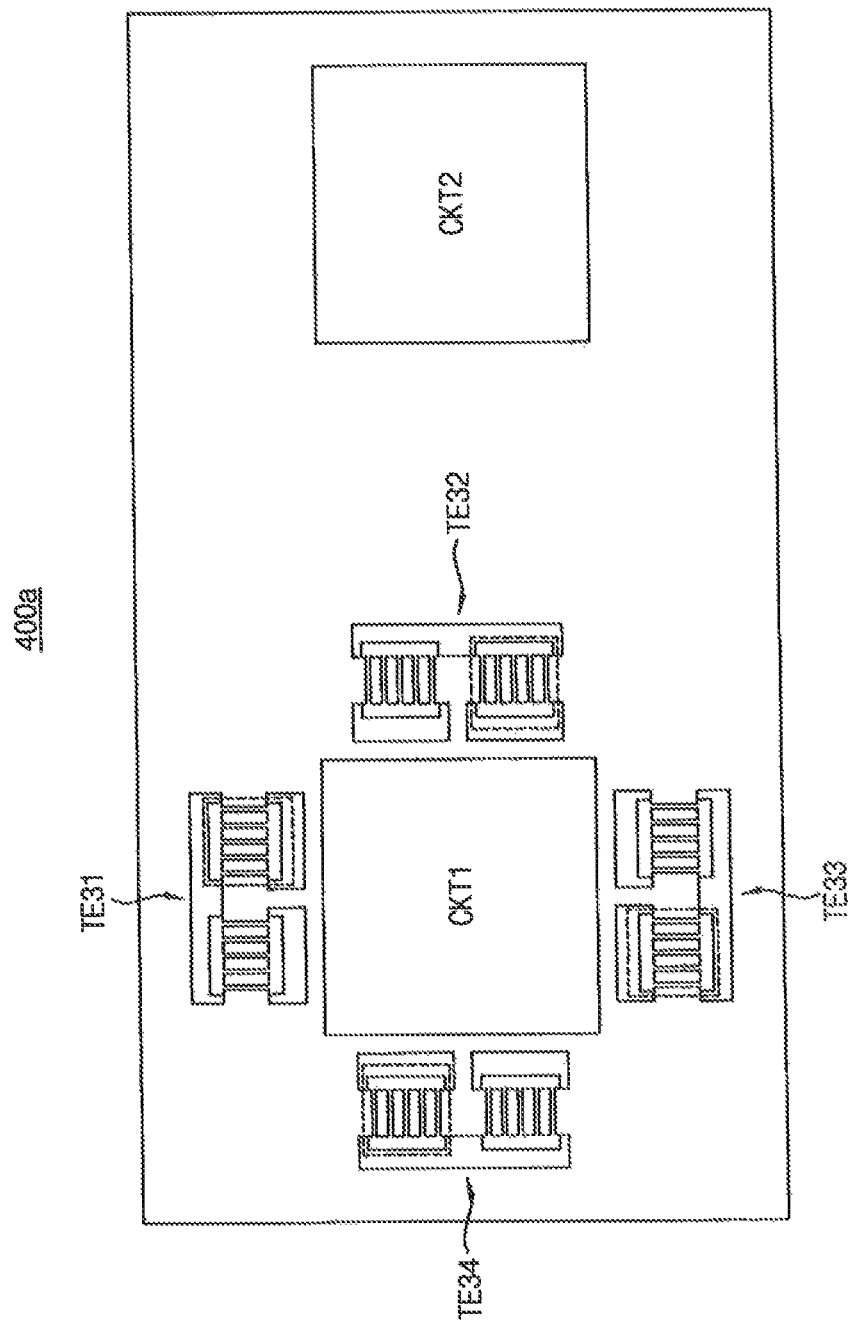
FIG. 16 is a plan view illustrating a semiconductor device according to exemplary embodiments of the present inventive concept.

FIG. 16 is a plan view illustrating a semiconductor device according to example embodiments.

Referring to FIGS. 15B and 16, a semiconductor device 400a includes a first semiconductor die 410. The first semiconductor die 410 includes a semiconductor substrate 411, a plurality of thermoelectric elements TE31, TE32, TE33 and TE34 and a first circuit CKT1. The first semiconductor die 410 may further include a second circuit CKT2.

The semiconductor device 400a of FIG. 16 may be substantially the same as the semiconductor device 400 of FIG. 15A, except that the plurality of thermoelectric elements TE31, TE32, TE33 and TE34 are disposed to surround the first circuit CKT1. A cross-sectional view of the semiconductor device 400a of FIG. 16 may be similar to FIG. 15B.

The semiconductor substrate 411 includes a first area A1 and a second area that is adjacent to the first area A1 and surrounds the first area A1. The first circuit CKT1 may include a plurality of active elements and a plurality of passive elements, may be disposed in the semiconductor substrate 411 and may be disposed in the first area A1. The thermoelectric elements TE31, TE32, TE33 and TE34 are formed in the second area of the semiconductor substrate 411. Each of the thermoelectric elements TE31, TE32, TE33 and TE34 may be one of the thermoelectric element 100 of FIGS. 1A and 1B, the thermoelectric element 100a of FIG. 4, the thermoelectric element 200 of FIGS. 5A and 5B and the thermoelectric element 200a of FIG. 7. The thermoelectric elements TE31, TE32, TE33 and TE34 may perform one of the horizontal heat distributing operation and the energy generating operation.

The semiconductor device according to exemplary embodiments may include at least one on-die thermoelectric element that is integrated within the semiconductor device and performs the horizontal heat distributing operation and the energy generating operation. For example, integrated circuits and the at least one on-die thermoelectric element may be implemented within separate semiconductor dies, as in an example of FIGS. 8A and 8B, or the integrated circuits and the at least one on-die thermoelectric element may be implemented within one semiconductor die, as in examples of FIGS. 15A, 15B and 16. Thus, the temperature of the first area A1 corresponding to the hot spot may be reduced although the total average temperature of the semiconductor device is not changed. A local temperature in the semiconductor device, such as the temperature of the first area A1, should not exceed a critical temperature of the semiconductor device, which is a temperature above which the performance of the semiconductor device may degrade. Since the hot spot may be identified in designing and/or verifying the semiconductor device, thermal management may be performed for the semiconductor device by manufacturing the semiconductor device with the at least one on-die thermoelectric element.

Figure 17:
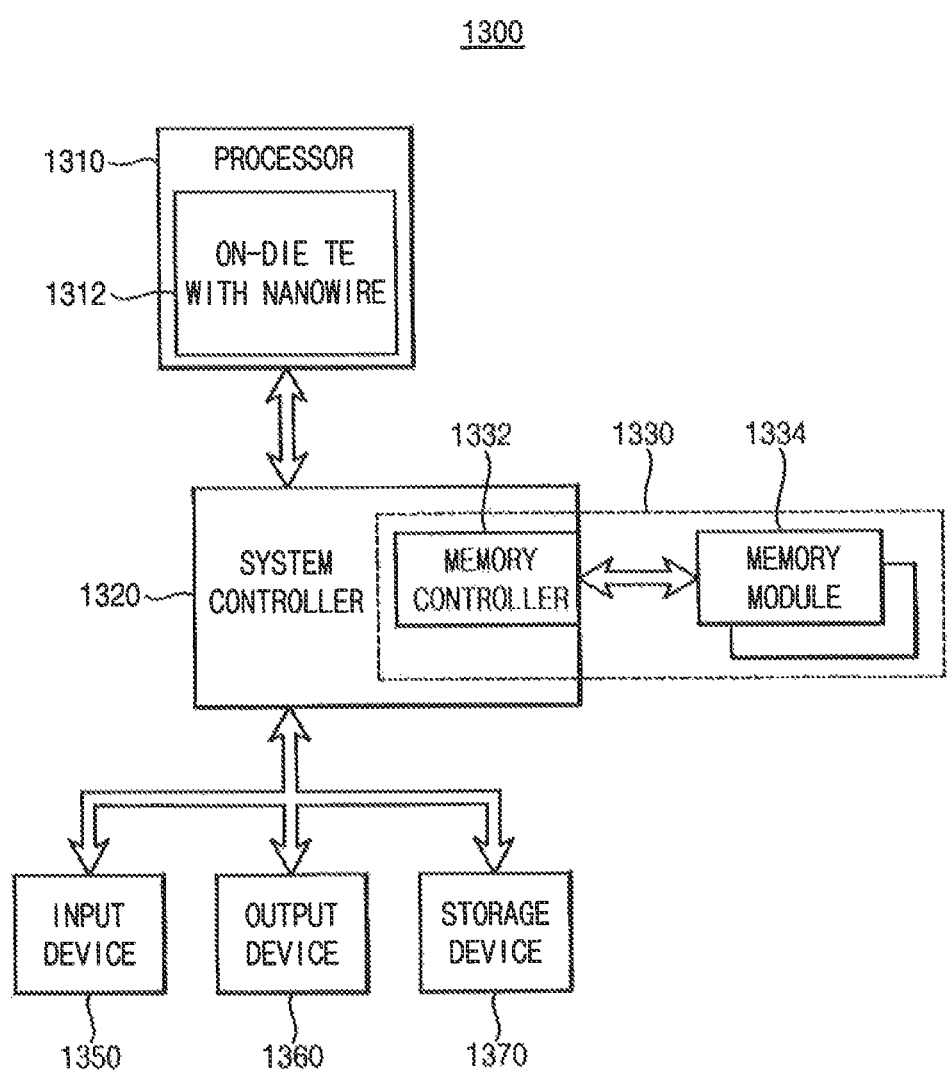
FIG. 17 is a block diagram of a memory system according to exemplary embodiments of the present inventive concept.

FIG. 17 is a block diagram of a memory system according to exemplary embodiments.

Referring to FIG. 17, a memory system 1300 includes a processor 1310, a system controller 1320 and a memory device 1330. The memory system 1300 may further include an input device 1350, an output device 1360 and a storage device 1370.

The memory device 1330 may include a plurality of memory modules 1334, and a memory controller 1332 for controlling the memory modules 1334. The memory modules 1334 may include at least one volatile memory, such as a dynamic random access memory (DRAM), a static random access memory (SRAM), and/or at least one nonvolatile memory, such as an electrically erasable programmable read-only memory (EEPROM), a flash memory, a phase change random access memory (PRAM), a resistance random access memory (RRAM), a magnetic random access memory (MRAM), a ferroelectric random access memory (FRAM), a nano floating gate memory (NFGM), or a polymer random access memory (PoRAM). The memory controller 1332 may be included in the system controller 1320.

The processor 1310 may perform various computing functions, such as executing specific software for performing specific calculations or tasks. The processor 1310 may be connected to the system controller 1320 via a processor bus. The system controller 1320 may be connected to the input device 1350, the output device 1360 and the storage device 1370 via an expansion bus. As such, the processor 1310 may control the input device 1350, the output device 1360 and the storage device 1370 using the system controller 1320.

The processor 1310 may be implemented as the semiconductor device according to exemplary embodiments. For example, the processor 1310 may include an on-die thermoelectric element 1312 which may be implemented using the exemplary embodiments described above with reference to FIGS. 1A, 1B, 2A, 2B, 2C, 2D, 3A, 3B, 4, 5A, 5B, 6A, 6B and 7. The processor 1310 may be implemented using the exemplary embodiment described above with reference to FIGS. 8A, 8B, 9A, 9B, 10, 11A, 11B, 12, 13, 14, 15A, 15B and 16. The on-die thermoelectric element 1312 may be integrated within the processor 1310 using the semiconductor nanowires. The on-die thermoelectric element 1312 integrated within the processor chip may selectively perform the horizontal heat distributing operation and the energy generating operation. Accordingly, hot spots in the processor chip may be eliminated without increasing a thickness of the processor chip, and the processor chip may have an increased energy efficiency.

Figure 18:
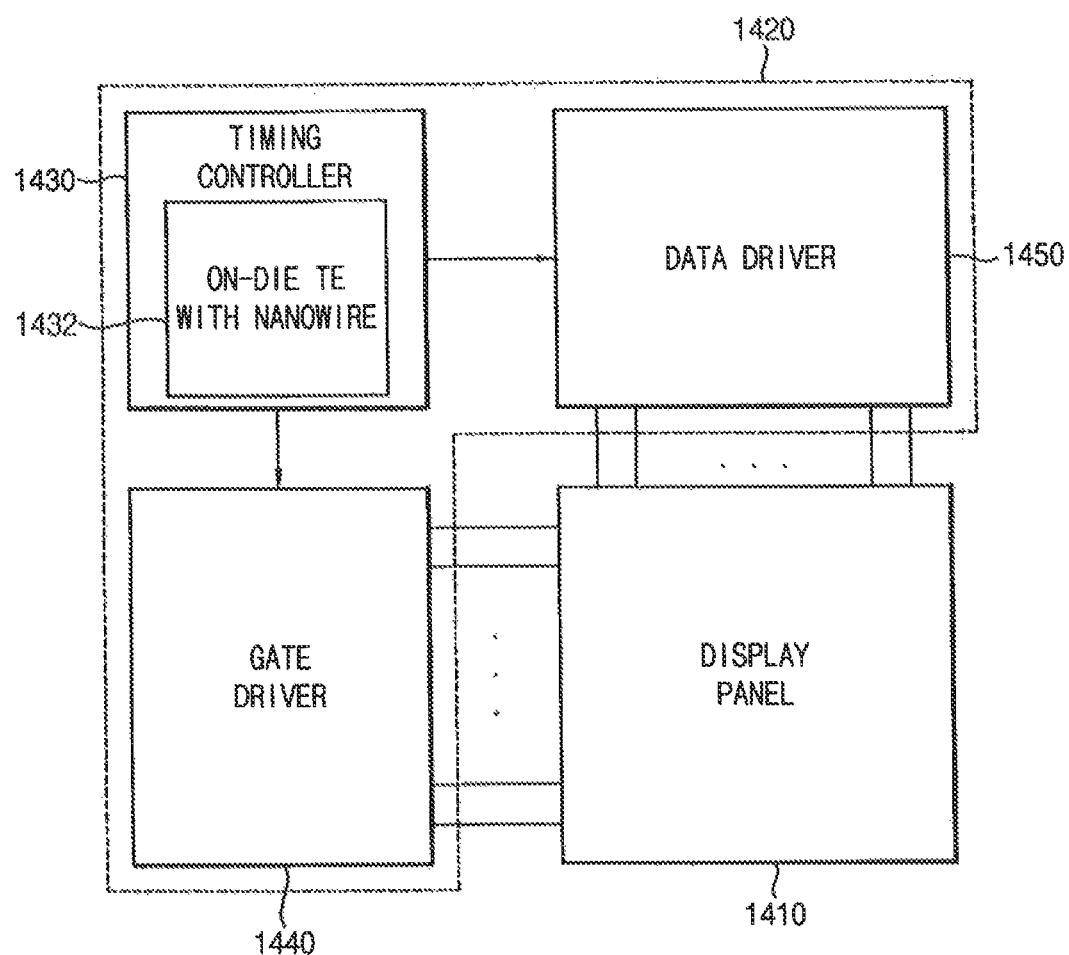
FIG. 18 is a block diagram of a display system according to exemplary embodiments of the present inventive concept.

FIG. 18 is a block diagram of a display system according to exemplary embodiments.

Referring to FIG. 18, a display system 1400 includes a display panel 1410 and a display driver integrated circuit (DDI) 1420.

The display panel 1410 may include a plurality of gate lines and a plurality of data lines. The display panel 1410 may include a pixel array having a plurality of pixels arranged in a matrix. Each pixel may correspond to a region in which one of the gate lines and one of the data lines intersect. The display panel 1410 may be one of a liquid crystal display (LCD) panel, a light emitting diode (LED) display panel, an organic LED (OLED) display panel, a field emission display (FED) panel, etc.

The DDI 1420 may control an operation of the display panel 1410. The DDI 1420 may include a timing controller 1430, a gate driver 1440 and a data driver 1450.

The timing controller 1430 may receive an image data signal and a system control signal from an external device, such as a graphics processing unit (GPU), and may generate a gate driver control signal, a data driver control signal and data based on the image data signal and the system control signal. The gate driver 1440 may selectively enable the gate lines of the display panel 1410 in response to the gate driver control signal to select a row of the pixel array. The data driver 1450 may apply a plurality of driving voltages to the data lines of the display panel 1410 based on the data driver control signal and the data. The display panel 1410 may be driven by the gate driver 1440 and the data driver 1450. An image corresponding to the image data signal may be displayed on the display panel 1410.

The timing controller 1430 may be implemented as the semiconductor device according to example embodiments. For example, the timing controller 1430 may include an on-die thermoelectric element 1432 which may be implemented using the exemplary embodiments described above with reference to FIGS. 1A, 1B, 2A, 2B, 2C, 2D, 3A, 3B, 4, 5A, 5B, 6A, 6B and 7. The timing controller 1430 may be implemented using the exemplary embodiments described above with reference to FIGS. 8A, 8B, 9A, 9B, 10, 11A, 11B, 12, 13, 14, 15A, 15B and 16. The on-die thermoelectric element 1432 may be integrated within the timing controller 1430 using the semiconductor nanowires. The on-die thermoelectric element 1432 integrated within the timing controller chip may selectively perform the horizontal heat distributing operation and the energy generating operation. Accordingly, hot spots in the timing controller chip may be eliminated without increasing a thickness of the timing controller chip, and the timing controller chip may have an increased energy efficiency.

Figure 19:
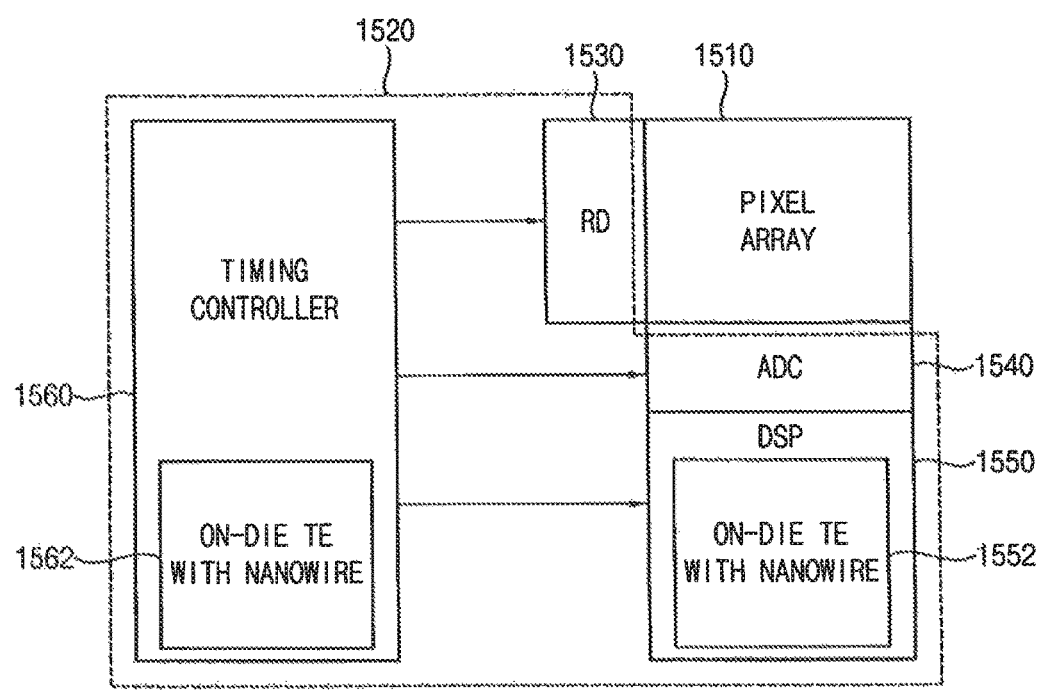
FIG. 19 is a block diagram of an image sensor system according to exemplary embodiments of the present inventive concept.

FIG. 19 is a block diagram of an image sensor system according to exemplary embodiments.

Referring to FIG. 19, an image sensor system 1500 includes a pixel array 1510 and a signal processing unit 1520.

The pixel array 1510 may generate electric signals based on incident light. The pixel array 1510 may include a plurality of unit pixels arranged in a matrix. For example, the pixel array 1510 may include a plurality of color pixels to provide color image information and/or a plurality of depth pixels to provide depth information, which is information about a distance or a depth of an object from the image sensor system 1500. If the pixel array 1510 includes a plurality of depth pixels, the image sensor system 1500 may further include a light source module (not illustrated) that emits light focused on the object.

The signal processing unit 1520 may generate image data based on the electric signals. The signal processing unit 1520 may include a row driving unit 1530, an analog-to-digital converting (ADC) unit 1540, a digital signal processing (DSP) unit 1550 and a timing controller 1560.

The row driving unit 1530 may be connected with each row of the pixel array 1510. The row driving unit 1530 may generate driving signals to drive each row. The ADC unit 1540 may be connected with each column of the pixel array 1510. The ADC unit 1540 may convert analog signals received from the pixel array 1510 into digital signals. According to exemplary embodiments, the ADC unit 1540 may include a correlated double sampling (CDS) unit for extracting an effective signal component. In some exemplary embodiments, the CDS unit may perform an analog double sampling that extracts the effective signal component based on a difference between an analog reset signal that includes a reset component and an analog data signal that includes a signal component. In other exemplary embodiments, the CDS unit may perform a digital double sampling that converts the analog reset signal and the analog data signal into two digital signals and extracts the effective signal component based on a difference between the two digital signals. In exemplary embodiments, the CDS unit may perform a dual correlated double sampling that performs both the analog double sampling and the digital double sampling. The DSP unit 1550 may receive the digital signals from the ADC unit 1540, and may perform image data processing on the digital signals. For example, the DSP unit 1550 may perform one or more of image interpolation, color correction, white balance, gamma correction, color conversion, etc. The timing controller 1560 may control the row driving unit 1530, the ADC unit 1540 and the DSP unit 1550 by providing control signals, such as a clock signal, a timing control signal, etc.

Each of the DSP unit 1550 and the timing controller 1560 may be implemented as the semiconductor device according to exemplary embodiments. For example, the DSP unit 1550 and the timing controller 1560 may include on-die thermoelectric elements 1552 and 1562 which may be implemented according to exemplary embodiments described with reference to FIGS. 1A, 1B, 2A, 2B, 2C, 2D, 3A, 3B, 4, 5A, 5B, 6A, 6B and 7. The DSP unit 1550 and the timing controller 1560 may be implemented according to exemplary embodiments described with reference to FIGS. 8A, 8B, 9A, 9B, 10, 11A, 11B, 12, 13, 14, 15A, 15B and 16. The on-die thermoelectric elements 1552 and 1562 may be integrated within the DSP unit 1550 and the timing controller 1560 using the semiconductor nanowires. The on-die thermoelectric elements 1552 and 1562 integrated within the DSP chip and the timing controller chip may selectively perform the horizontal heat distributing operation and the energy generating operation. Accordingly, hot spots in the DSP chip and the timing controller chip may be eliminated without increasing thicknesses of the DSP chip and the timing controller chip, and the DSP chip and the timing controller chip may have an increased energy efficiency.

Figure 20:
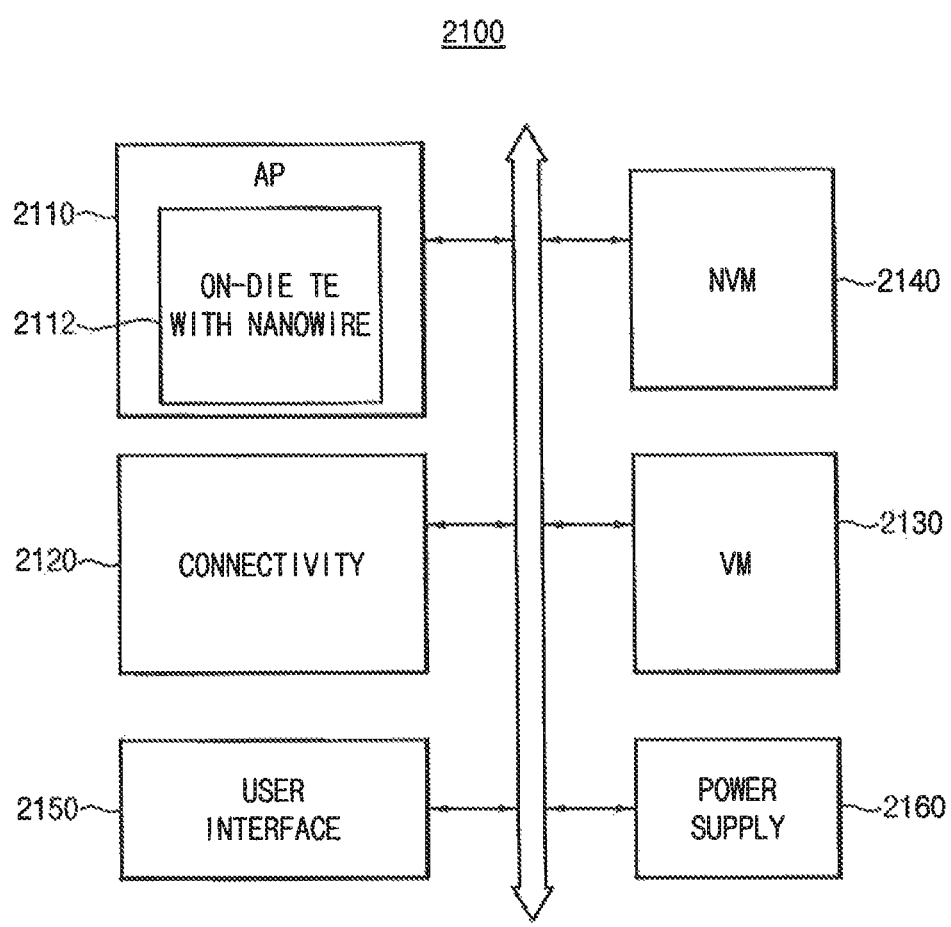
FIG. 20 is a block diagram of a mobile system according to exemplary embodiments of the present inventive concept.

FIG. 20 is a block diagram of a mobile system according to exemplary embodiments.

Referring to FIG. 20, a mobile system 2100 includes an AP 2110, a connectivity unit 2120, a volatile memory device 2130, a nonvolatile memory device 2140, a user interface 2150 and a power supply 2160. According to exemplary embodiments, the mobile system 2100 may be any mobile system, such as a mobile phone, a smart phone, a tablet computer, a laptop computer, a personal digital assistants (PDA), a portable multimedia player (PMP), a digital camera, a portable game console, a music player, a camcorder, a video player, a navigation system, etc.

The AP 2110 may execute applications, such as an internet browser, a game application, a video player application, etc. According to exemplary embodiments, the AP 2110 may include a single processor core or a plurality of processor cores. For example, the AP 2110 may be a multi-core processor, such as a dual-core processor, a quad-core processor, a hexa-core processor, etc. In some exemplary embodiments, the AP 2110 may further include a cache memory located inside or outside the AP 2110.

The connectivity unit 2120 may perform wired or wireless communication with an external device. For example, the connectivity unit 2120 may perform a USB communication, an Ethernet communication, a near field communication (NFC), a radio frequency identification (RFID) communication, a mobile telecommunication, a memory card communication, wireless internet, wireless fidelity (Wi-Fi), global positioning system (GPS), Bluetooth (BT), global system for mobile communication (GSM), general packet radio system (GPRS), wideband code division multiple access (WCDMA), high speed uplink/downlink packet access (HSxPA), etc. The connectivity unit 2120 may include a baseband chipset.

The volatile memory device 2130 may store an instruction/data processed by the AP 2110, or may serve as a working memory. For example, the volatile memory device 2130 may be implemented by a dynamic random access memory (DRAM), a static random access memory (SRAM), a mobile DRAM, a dual data rate (DDR) synchronous DRAM (SDRAM), a low power DDR (LPDDR) SDRAM, a graphic DDR (GDDR) SDRAM, a Rambus DRAM (RDRAM), etc.

The nonvolatile memory device 2140 may store a boot image for booting the mobile system 2100. For example, the nonvolatile memory device 2140 may be implemented by an EEPROM, a flash memory, a PRAM, a RRAM, a MRAM, a FRAM, a NFGM, a PoRAM, etc.

The user interface 2150 may include at least one input device, such as a keypad, a touch screen, etc., and at least one output device, such as a display device, a speaker, etc. The power supply 2160 may supply the mobile system 2100 with power. In some exemplary embodiments, the mobile system 2100 may further include a camera image processor (CIS) storage device, such as a memory card, a solid state drive (SSD), a CD-ROM, etc.

The AP 2110 may be implemented as the semiconductor device according to exemplary embodiments. For example, the AP 2110 may include an on-die thermoelectric element 2112 which may be implemented by the examples such as those described above with reference to FIGS. 1A, 1B, 2A, 2B, 2C, 2D, 3A, 3B, 4, 5A, 5B, 6A, 6B and 7. The AP 2110 may be implemented using the exemplary embodiment described above with reference to FIGS. 8A, 8B, 9A, 9B, 10, 11A, 11B, 12, 13, 14, 15A, 15B and 16. The on-die thermoelectric element 2112 may be integrated within the AP 2110 using the semiconductor nanowires. The on-die thermoelectric element 2112 integrated within the AP chip may selectively perform the horizontal heat distributing operation and the energy generating operation. Accordingly, hot spots in the AP chip may be eliminated without increasing a thickness of the AP chip, and the AP chip may have an increased energy efficiency.

According to exemplary embodiments, the mobile system 2100 and/or components of the mobile system 2100 may be packaged in various forms, such as a package on package (PoP), a ball grid arrays (BGA), a chip scale packages (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline IC (SOIC), a shrink small outline package (SSOP), a thin small outline package (TSOP), a system in package (SIP), a multi chip package (MCP), a wafer-level fabricated package (WFP), or a wafer-level processed stack package (WSP).

Figure 21:
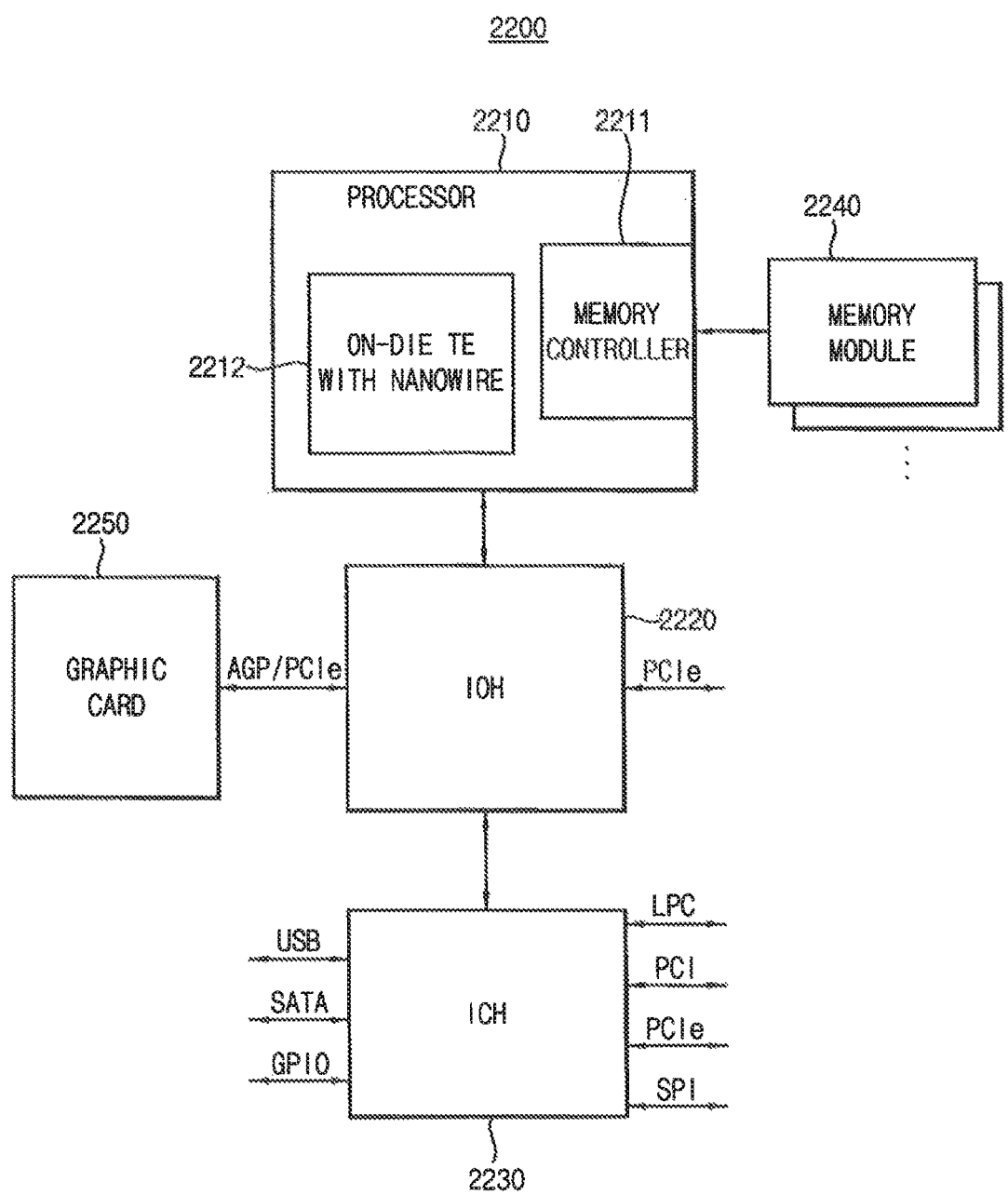
FIG. 21 is a block diagram of a computing system according to exemplary embodiments of the present inventive concept.

FIG. 21 is a block diagram of a computing system according to exemplary embodiments.

Referring to FIG. 21, a computing system 2200 includes a processor 2210, an input/output (I/O) hub 2220, an I/O controller hub 2230, at least one memory module 2240 and a graphic card 2250. According to exemplary embodiments, the computing system 2200 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, etc.

The processor 2210 may perform specific calculations or tasks. For example, the processor 2210 may be a microprocessor, a CPU, a digital signal processor, etc. According to exemplary embodiments, the processor 2210 may include a single processor core or a plurality of processor cores. For example, the processor 2210 may be a multi-core processor, such as a dual-core processor, a quad-core processor, a hexa-core processor, etc. Although FIG. 21 illustrates the computing system 2200 that includes one processor 2210, according to exemplary embodiments, the computing system 2200 may include two or more processors. In some example embodiments, the processor 2210 may further include a cache memory located inside or outside the processor 2210.

The processor 2210 may include a memory controller 2211 that controls an operation of the memory module 2240. The memory controller 2211 included in the processor 2210 may be referred to as an integrated memory controller (IMC). A memory interface between the memory controller 2211 and the memory module 2240 may be implemented by one channel that includes a plurality of signal lines, or by a plurality of channels. Each channel may be coupled to at least one memory module 2240. In some exemplary embodiments, the memory controller 2211 may be included in the I/O hub 2220. The I/O hub 2220 with the memory controller 2211 may be referred to as a memory controller hub (MCH). The memory module 2240 may include a plurality of nonvolatile memory devices and/or a plurality of volatile memory devices that store data received from the memory controller 2211.

The I/O hub 2220 may manage data transferred between the processor 2210 and devices, such as the graphic card 2250. The I/O hub 2220 may be coupled to the processor 2210 via at least one of various interfaces, such as a front side bus (FSB), a system bus, a HyperTransport, a lightning data transport (LDT), a QuickPath interconnect (QPI), a common system interface (CSI), etc. Although FIG. 21 illustrates the computing system 2200 that includes one I/O hub 2220, according to exemplary embodiments, the computing system 2200 may include a plurality of I/O hubs.

The I/O hub 2220 may provide various interfaces with the devices. For example, the I/O hub 2220 may provide an accelerated graphics port (AGP) interface, a peripheral component interface-express (PCIe), a communications streaming architecture (CSA) interface, etc.

The graphics card 2250 may be coupled to the I/O hub 2220 via an AGP or a PCIe. The graphic card 2250 may control a display device that displays an image. The graphic card 2250 may include an internal processor and an internal memory to process the image. In some example embodiments, the input/output hub 2220 may include an internal graphics device along with or instead of the graphics card 2250. The internal graphics device may be referred to as an integrated graphics, and an I/O hub that includes the memory controller and the internal graphic device may be referred to as a graphics and memory controller hub (GMCH).

The I/O controller hub 2230 may perform data buffering and interface arbitration to efficiently operate various system interfaces. The I/O controller hub 2230 may be coupled to the I/O hub 2220 via an internal bus. For example, the I/O controller hub 2230 may be coupled to the I/O hub 2220 via at least one of various interfaces, such as a direct media interface (DMI), a hub interface, an enterprise Southbridge interface (ESI), PCIe, etc.

The I/O controller hub 2230 may provide various interfaces with peripheral devices. For example, the I/O controller hub 2230 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

The processor 2210 may include an on-die thermoelectric element 2212 which may be implemented using the exemplary embodiments described above with reference to FIGS. 1A, 1B, 2A, 2B, 2C, 2D, 3A, 3B, 4, 5A, 5B, 6A, 6B and 7. The processor 2210 may be implemented using the exemplary embodiments described above with reference to FIGS. 8A, 8B, 9A, 9B, 10, 11A, 11B, 12, 13, 14, 15A, 15B and 16. The on-die thermoelectric element 2212 may be integrated within the processor 2210 using the semiconductor nanowires. The on-die thermoelectric element 2212 integrated within the processor chip may selectively perform the horizontal heat distributing operation and the energy generating operation. Accordingly, hot spots in the processor chip may be eliminated without increasing the thickness of a processor chip, and the processor chip may have an increased energy efficiency.

In some exemplary embodiments, the processor 2210, the I/O hub 2220 and the I/O controller hub 2230 may be implemented as separate chipsets or separate integrated circuits. In other exemplary embodiments, at least two of the processor 2210, the I/O hub 2220 and the I/O controller hub 2230 may be implemented as one chipset.

The present disclosure may be used in any device or system including the thermoelectric element and the semiconductor device, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A thermoelectric element comprising:
   a semiconductor substrate;
   a plurality of first semiconductor fin structures and a plurality of second semiconductor fin structures disposed on the semiconductor substrate, each of the first and second semiconductor fin structures extending in a first direction and protruding from the semiconductor substrate;
   a plurality of first semiconductor nanowires disposed on the first semiconductor fin structures, the first semiconductor nanowires including first impurities;
   a plurality of second semiconductor nanowires disposed on the second semiconductor fin structures, the second semiconductor nanowires including second impurities different from the first impurities;
   a first electrode connected to first ends of the first semiconductor nanowires and first ends of the second semiconductor nanowires;
   a second electrode connected to second ends of the first semiconductor nanowires;
   a third electrode connected to second ends of the second semiconductor nanowires; and
   a first well region positioned under the second semiconductor fin structures.

2. The thermoelectric element of claim 1,
   wherein the first well region is formed in the semiconductor substrate.

3. The thermoelectric element of claim 2, wherein each of the first well region and the second semiconductor fin structures includes the first impurities,
   wherein each of the semiconductor substrate and the first semiconductor fin structures include the second impurities.

4. The thermoelectric element of claim 3, wherein a doping density of the first semiconductor nanowires is higher than a doping density of the first well region and a doping density of the second semiconductor fin structures,
   wherein a doping density of the second semiconductor nanowires is higher than a doping density of the semiconductor substrate and a doping density of the first semiconductor fin structures.

5. The thermoelectric element of claim 1, further comprising:
   a first insulation layer disposed between the first and second semiconductor fin structures on the semiconductor substrate; and
   a second insulation layer disposed between the first and second semiconductor nanowires on the first insulation layer.

6. The thermoelectric element of claim 1, wherein each of the first and second semiconductor fin structures extends in the first direction with a straight line shape.

7. The thermoelectric element of claim 1, wherein the first electrode is disposed in a first area of the semiconductor substrate, and the second and third electrodes are disposed in a second area of the semiconductor substrate,
   wherein one of a horizontal heat distributing operation and an energy generating operation is performed by the thermoelectric element, wherein in the horizontal heat distributing operation, heat generated from the first area is distributed toward the second area, and wherein in the energy generating operation, power is generated from the heat generated at the first area.

8. The thermoelectric element of claim 7, wherein in the horizontal heat distributing operation, a first voltage is applied between the second and third electrodes,
   wherein in the energy generating operation, a second voltage is generated between the second and third electrodes.

9. A thermoelectric element comprising:
   a semiconductor substrate;
   a plurality of first semiconductor fin structures and a plurality of second semiconductor fin structures disposed on the semiconductor substrate, each of the first and second semiconductor fin structures extending in a first direction and protruding from the semiconductor substrate;
   a plurality of first semiconductor nanowires disposed on the first semiconductor fin structures, the first semiconductor nanowires including first impurities;
   a plurality of second semiconductor nanowires disposed on the second semiconductor fin structures, the second semiconductor nanowires including second impurities different from the first impurities;
   a first electrode connected to first ends of the first semiconductor nanowires and first ends of the second semiconductor nanowires;
   a second electrode connected to second ends of the first semiconductor nanowires;
      a third electrode connected to second ends of the second semiconductor nanowires; and
   a first well region positioned under the second semiconductor fin structures,
   wherein each of the first well region and the second semiconductor fin structures includes the first impurities, and wherein each of the semiconductor substrate and the first semiconductor fin structures include the second impurities.

10. The thermoelectric element of claim 9, wherein a doping density of the first semiconductor nanowires is higher than a doping density of the first well region and a doping density of the second semiconductor fin structures,
wherein a doping density of the second semiconductor nanowires is higher than a doping density of the semiconductor substrate and a doping density of the first semiconductor fin structures.

11. The thermoelectric element of claim 9, further comprising:
a first insulation layer disposed between the first and second semiconductor fin structures on the semiconductor substrate; and
a second insulation layer disposed between the first and second semiconductor nanowires on the first insulation layer.

12. The thermoelectric element of claim 9, wherein each of the first and second semiconductor fin structures extends in the first direction with a straight line shape.

13. The thermoelectric element of claim 9, wherein the first electrode is disposed in a first area of the semiconductor substrate, and the second and third electrodes are disposed in a second area of the semiconductor substrate,
wherein one of a horizontal heat distributing operation and an energy generating operation is performed by the thermoelectric element, wherein in the horizontal heat distributing operation, heat generated from the first area is distributed toward the second area, and wherein in the energy generating operation, power is generated from the heat generated at the first area.

14. The thermoelectric element of claim 13, wherein in the horizontal heat distributing operation, a first voltage is applied between the second and third electrodes,
wherein in the energy generating operation, a second voltage is generated between the second and third electrodes.

15. A thermoelectric element comprising:
a semiconductor substrate;
a plurality of first semiconductor fin structures and a plurality of second semiconductor fin structures disposed on the semiconductor substrate, each of the first and second semiconductor fin structures extending in a first direction and protruding from the semiconductor substrate;
a plurality of first semiconductor nanowires disposed on the first semiconductor fin structures, the first semiconductor nanowires including first impurities;
a plurality of second semiconductor nanowires disposed on the second semiconductor fin structures, the second semiconductor nanowires including second impurities different from the first impurities;
a first electrode connected to first ends of the first semiconductor nanowires and first ends of the second semiconductor nanowires;
a second electrode connected to second ends of the first semiconductor nanowires;
a third electrode connected to second ends of the second semiconductor nanowires; and
a first well region positioned under the second semiconductor fin structure, wherein the first well region is formed in the semiconductor substrate,
wherein a doping density of the first semiconductor nanowires is higher than a doping density of the first well region and a doping density of the second semiconductor fin structures, and
wherein a doping density of the second semiconductor nanowires is higher than a doping density of the semiconductor substrate and a doping density of the first semiconductor fin structures.

* * * * *